US012205855B2

(12) United States Patent
Hsiao et al.

(10) Patent No.: US 12,205,855 B2
(45) Date of Patent: Jan. 21, 2025

(54) PROCESS TOOL FOR ANALYZING BONDED WORKPIECE INTERFACE

(71) Applicant: Taiwan Semiconductor Manufacturing Company, Ltd., Hsinchu (TW)

(72) Inventors: Hau-Yi Hsiao, Chiayi (TW); Kuo-Ming Wu, Zhubei (TW); Chun Liang Chen, Tainan (TW); Sheng-Chau Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 679 days.

(21) Appl. No.: 17/412,330

(22) Filed: Aug. 26, 2021

(65) Prior Publication Data

US 2023/0069432 A1 Mar. 2, 2023

(51) Int. Cl.
*H01L 21/66* (2006.01)
*G01N 21/95* (2006.01)
*H01L 21/56* (2006.01)

(52) U.S. Cl.
CPC ......... *H01L 22/26* (2013.01); *G01N 21/9501* (2013.01); *H01L 21/563* (2013.01); *H01L 22/12* (2013.01); *H01L 22/34* (2013.01); *G01N 2201/11* (2013.01)

(58) Field of Classification Search
CPC ......... H01L 22/12; H01L 22/26; H01L 22/34; H01L 21/563; H01L 24/00; H01L 24/82; G01N 21/9501; G01N 2201/11
See application file for complete search history.

(56) References Cited

U.S. PATENT DOCUMENTS 9,588,041 B2 * 3/2017 White ................... G01N 29/04
2012/0314212 A1 * 12/2012 Jang ....................... G01N 21/94
356/239.3

OTHER PUBLICATIONS

Pnghut.com "Gaussian Beam Light Laser Optics—Triangle—Aperture Range Transparent PNG." Published on May 19, 2018.

* cited by examiner

*Primary Examiner* — Dale E Page
*Assistant Examiner* — Quovaunda Jefferson
(74) *Attorney, Agent, or Firm* — Eschweiler & Potashnik, LLC

(57) ABSTRACT

The present disclosure relates to a method and an associated process tool. The method includes generating electromagnetic radiation that is directed toward a perimeter of a pair of bonded workpieces and toward a radiation sensor that is arranged behind the perimeter of the pair of bonded workpieces. The electromagnetic radiation is scanned along a vertical axis. An intensity of the electromagnetic radiation that impinges on the radiation sensor is measured throughout the scanning. Measuring the intensity includes recording a plurality of intensity values of the electromagnetic radiation at a plurality of different positions along the vertical axis extending past top and bottom surfaces of the pair of bonded workpieces. A position of an interface between the pair of bonded workpieces is determined based on a maximum measured intensity value of the plurality of intensity values.

20 Claims, 13 Drawing Sheets

600

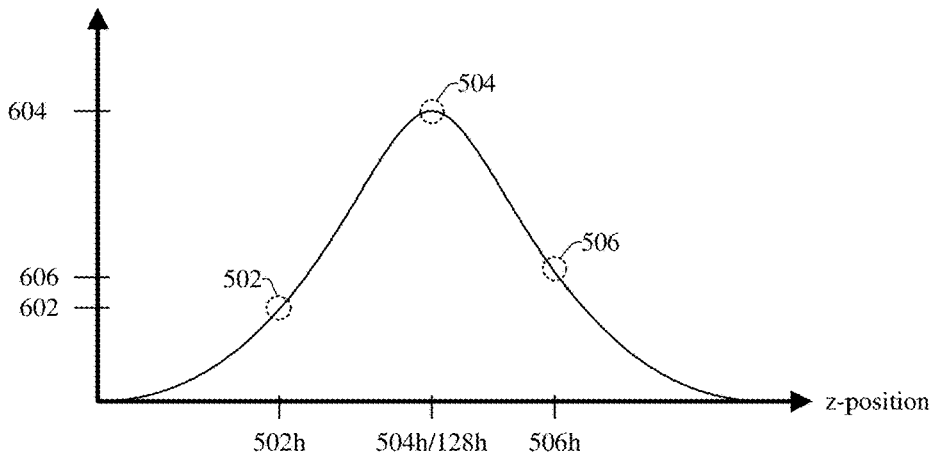

Generate electromagnetic radiation that is directed toward a perimeter of a pair of bonded workpieces — 702

Scan with the electromagnetic radiation along a vertical axis — 704

Measure an intensity of the electromagnetic radiation that makes it past the perimeter of the pair of bonded workpieces throughout the scanning — 706

Determine a position of an interface between the pair of bonded workpieces based on the position along the vertical axis that corresponds with a maximum measured intensity of the electromagnetic radiation — 708

Fig. 7

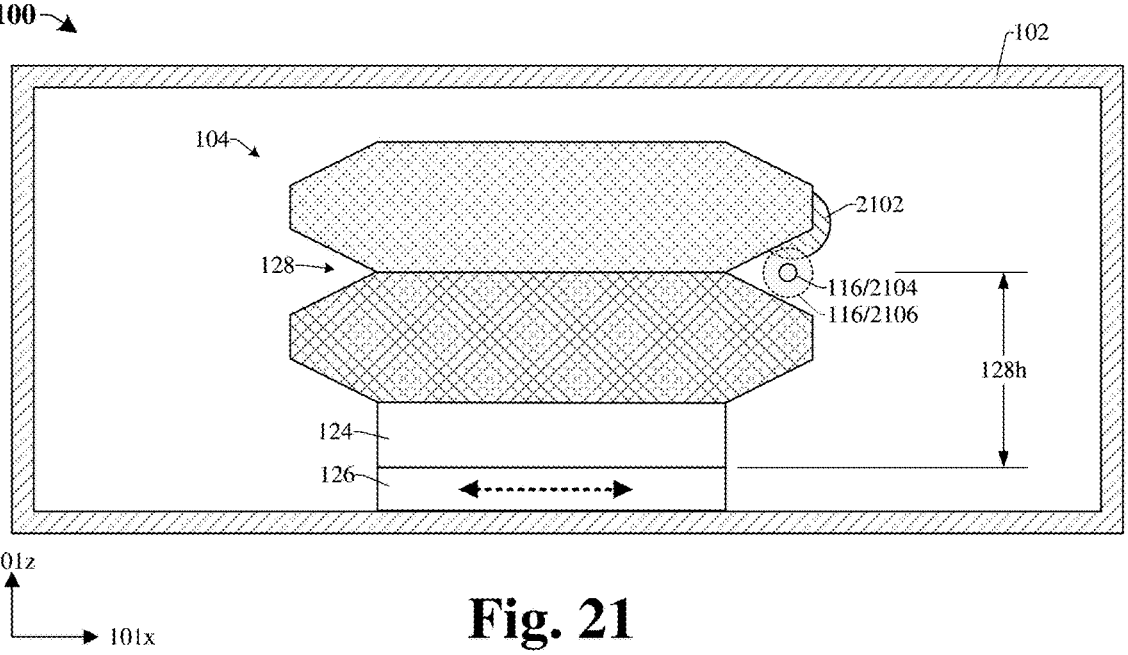
Fig. 21
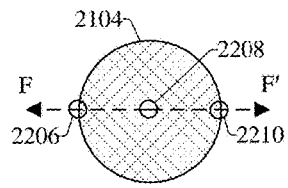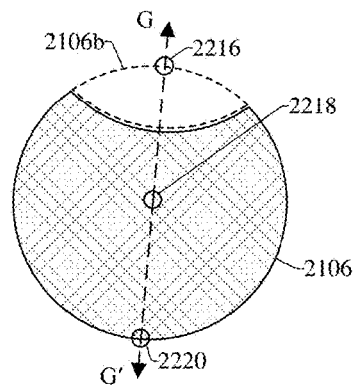
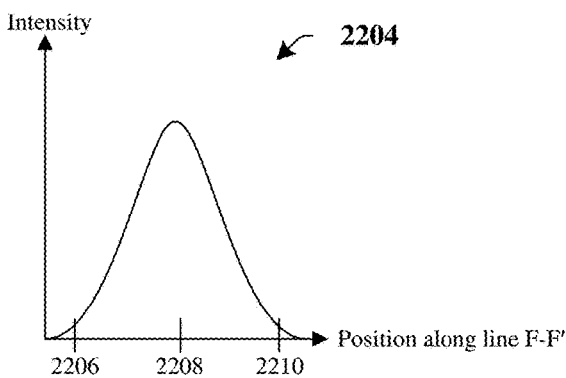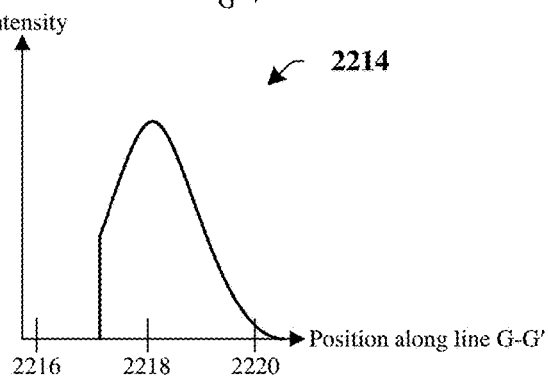
Fig. 22

PROCESS TOOL FOR ANALYZING BONDED WORKPIECE INTERFACE

BACKGROUND

Semiconductor device fabrication is a process used to create integrated circuits that are present in everyday electronic devices. A fabrication process is a multiple-step sequence comprising deposition, photolithographic, and chemical processing steps during which electronic circuits are gradually created on a wafer. During a fabrication process of a multi-dimensional integrated chip (e.g., a 3DIC), bonding processing steps may also be used to bond a wafer to another wafer along an interface between the wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4-6 illustrate figures corresponding to some embodiments of a method for determining a position of an interface between a pair of bonded workpieces.

FIG. 7 illustrates a flow diagram of some embodiments of a method for determining a position of an interface between a pair of bonded workpieces

FIGS. 18-22 illustrate figures corresponding to some embodiments of a method for determining a position of an underfill that is formed along an interface between a pair of bonded workpieces.

DETAILED DESCRIPTION

Figure 1:
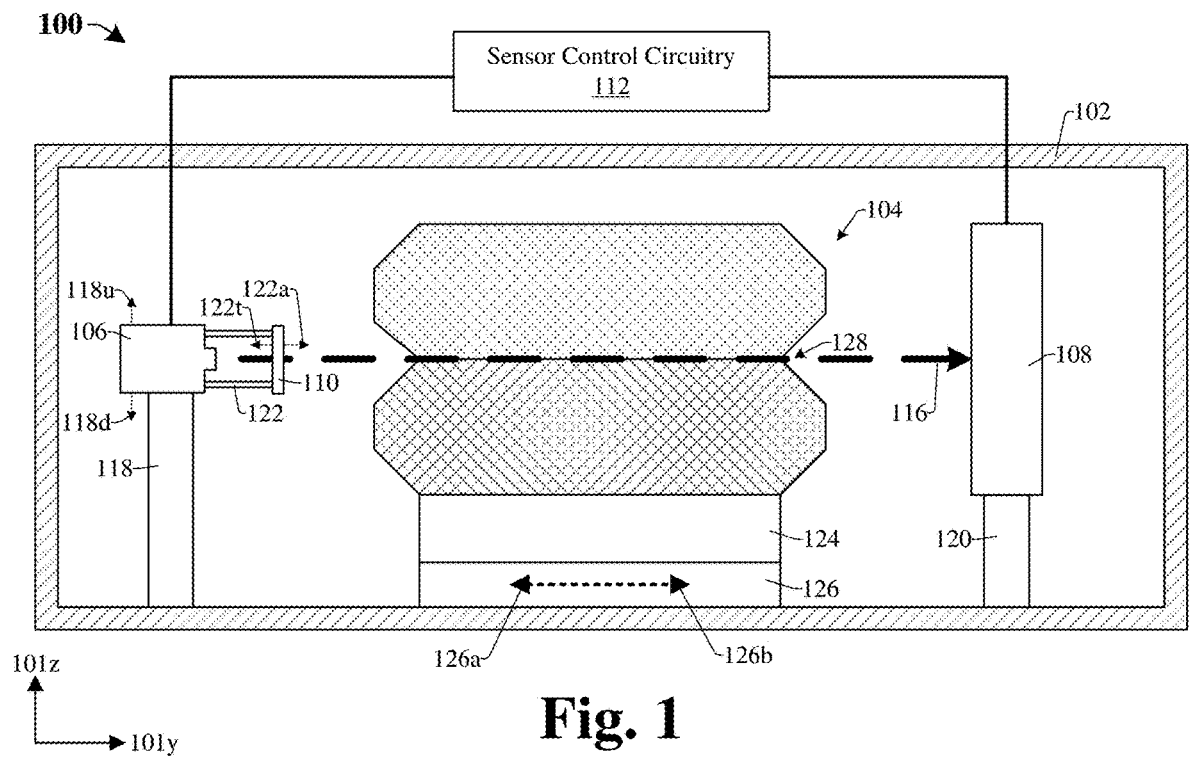
FIG. 1 illustrates a cross-sectional view of some embodiments of a process tool comprising a radiation source, a radiation sensor, and sensor control circuitry for determining a position of an interface between a pair of bonded workpieces.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During semiconductor fabrication, wafers may be bonded to form three-dimensional integrated circuits or some other stacked integrated circuit. Oftentimes the wafers have beveled edges that leave a gap along a perimeter of an interface between the wafers. After bonding, one or more of the wafers may undergo one or more thinning processes (e.g., grinding processes or the like). A force applied to the wafers during the thinning process may cause damage at the gap along the perimeter of the interface. For example, the force applied to the wafers may increase a likelihood that dielectric layers (e.g., inter-level dielectric (ILD) layers) disposed on the wafers experience peeling or some other damage. To prevent this damage from occurring during the thinning process, a seal (e.g., comprising an underfill or the like) may be formed in a closed path along the perimeter of the interface to fill the gap before the thinning process is performed. The seal may increase the structural integrity of the wafer bond along the perimeter of the bonded wafers and hence may reduce the likelihood that peeling or other damage of the wafer(s) occur during the thinning process.

In some processes, the seal path (e.g., along the perimeter of the interface) may be defined by capturing an image (e.g., with a camera) of the perimeter of the bonded wafers, determining the positions of the bevels of the bonded wafers based on the captured image, and determining the position of the interface between the bonded wafers based on the positions of the bevels. The seal may then be formed along the determined seal path (e.g., along a perimeter of the determined interface). However, this method of determining the seal path may be easily affected by the quality of the beveled edges of the bonded wafers and/or by the quality of the image of the beveled edges. For example, if the beveled edges are rounded or otherwise smooth, the image may not clearly show the position of the beveled edges. Further, if the image is not clear, the positions of the beveled edges may be unclear. As a result, errors may occur when determining the seal path and hence the seal may be formed in a wrong position (e.g., not at the interface). Incorrect formation of the seal may lead to peeling of the dielectric layers and/or other wafer damage during the thinning process(es).

Various embodiments of the present disclosure are related to a method for determining a position of an interface between a pair of bonded workpieces with improved accuracy, and an associated process tool. The method comprises generating, with a radiation source, electromagnetic radiation that is directed toward a perimeter of the pair of bonded workpieces and toward a radiation sensor that is arranged behind the perimeter of the pair of bonded workpieces. The radiation source scans the electromagnetic radiation along a vertical axis extending between the bonded workpieces. Further, the radiation sensor measures an intensity of the electromagnetic radiation that impinges on the radiation sensor throughout the scanning. Measuring the intensity comprises recording a plurality of radiation intensity values that correspond to respective positions of the plurality of different positions along the vertical axis. Finally, the position of the interface between the pair of bonded workpieces is determined based on the position along the vertical axis that corresponds with a maximum measured radiation intensity value.

By using the radiation source and radiation sensor to determine the position of the interface instead of a camera, an accuracy of the determination of the position of the interface between the bonded workpieces may be improved. For example, since the radiation source and radiation sensor do not rely on the quality of the edges of the bonded workpieces at the interface, nor on the quality of an image captured by a camera, errors in the determination of the position of the interface may be reduced and hence the accuracy of the determination may be improved.

FIG. 1 illustrates a cross-sectional view 100 of some embodiments of a process tool comprising a radiation source 106, a radiation sensor 108, and sensor control circuitry 112 for determining a position of an interface 128 between a pair of bonded workpieces 104. In some embodiments, FIG. 1 is illustrated in an z-y plane (e.g., extending along axes 101z and 101y).

The process tool comprises a process chamber 102. In some embodiments, a wafer chuck 124 configured to hold a workpiece is disposed within the process chamber 102. In some embodiments, the workpiece may comprise the pair of bonded workpieces 104. In some embodiments, the wafer chuck 124 is arranged on a rotor device 126 that is configured to rotate the wafer chuck 124 and the pair of bonded workpieces 104 in clockwise 126a and/or counterclockwise 126b directions.

The radiation source 106 is adjacent to the wafer chuck 124 and is arranged along a perimeter of the wafer chuck 124. The radiation source 106 is configured to generate electromagnetic radiation 116 toward the radiation sensor 108 (e.g., ultraviolet radiation, visible light radiation, infrared radiation, or some other electromagnetic radiation). In some embodiments, the radiation source 106 is configured to vertically scan the electromagnetic radiation 116 over the pair of bonded workpieces 104 (e.g., between top and bottom surfaces of the pair of bonded workpieces 104 and/or past the top and bottom surfaces of the pair of bonded workpieces 104). In some embodiments, the radiation source 106 is coupled to a first actuator device 118. In some embodiments, the first actuator device 118 is configured to move the radiation source 106 up (e.g., 118u) and down (e.g., 118d) along a vertical axis 101z. In some embodiments, the vertical axis 101z extends from below the pair of bonded workpieces 104 to above the pair of bonded workpieces 104. In some other embodiments, the first actuator device 118 is alternatively configured to tilt the radiation source 106 up and down.

The radiation sensor 108 is adjacent to the wafer chuck 124, is arranged along the perimeter of the wafer chuck 124, is spaced apart from the radiation source 106, and is facing the radiation source 106. The radiation sensor 108 is configured to measure an intensity of the electromagnetic radiation 116 that impinges on the radiation sensor 108. In some embodiments, the radiation sensor 108 is arranged on a radiation sensor stand 120. The radiation sensor stand 120 may be have a fixed position. The radiation sensor 108 may have a sensing area that is large enough to receive the electromagnetic radiation 116 over a height of the bonded pair of workpieces 104. For example, the sensing area of the radiation sensor 108 may be large enough so that the radiation sensor 108 does not have to move along the vertical axis 101z with the radiation source 106 in order to measure the electromagnetic radiation 116 generated by the radiation source 106 at different heights along the vertical axis 101z. In some embodiments, the radiation sensor 108 has a sensing area that extends along the vertical axis 101z at least along the heights at which the radiation source 106 is configured to generate electromagnetic radiation (e.g., extends from a bottom of the pair of bonded workpieces 104 to a top of the pair of bonded workpieces 104).

In some embodiments, an optical assembly 110 is configured to focus the electromagnetic radiation 116 is adjacent to the radiation source 106. In some embodiments, the optical assembly 110 may comprise one or more lenses and/or mirrors. In some embodiments, one or more components (e.g., lenses and/or mirrors) of the optical assembly 110 are arranged on a second actuator device 122 that is attached to the radiation source 106 and that is configured to move the one or more components towards (e.g., 122t) and away from (e.g., 122a) the radiation source 106 along a horizontal axis 101y to adjust a focus of the electromagnetic radiation 116 generated by the radiation source 106. In some other embodiments, the position of the optical assembly 110 relative to the position of the radiation source 106 is fixed. In such embodiments, the optical assembly 110 and the radiation source 106 may both be configured to move horizontally along the horizontal axis 101y together (e.g., by way of the first actuator device 118).

The sensor control circuitry 112 is electrically coupled to the radiation sensor 108 and the radiation source 106. In some embodiments, the sensor control circuitry is also electrically coupled to the first actuator device 118, and/or the second actuator device 122. The sensor control circuitry 112 is configured to determine a seal path (e.g., a position of the interface 128 between the pair of bonded workpieces 104 along a perimeter of the interface 128 extending over 360°) based on a measured intensity of the electromagnetic radiation 116 that is generated by the radiation source 106 and measured by the radiation sensor 108.

By using the radiation source 106 and radiation sensor 108 to determine the position of the interface 128 instead of a camera, an accuracy of the determination of the position of the interface 128 between the bonded workpieces 104 may be improved. For example, since the radiation source 106 and radiation sensor 108 do not rely on the quality of the edges of the bonded workpieces 104 at the interface 128, nor on the quality of an image captured by a camera, errors in the determination of the position of the interface 128 may be reduced and hence the accuracy of the determination may be improved.

Figure 2:
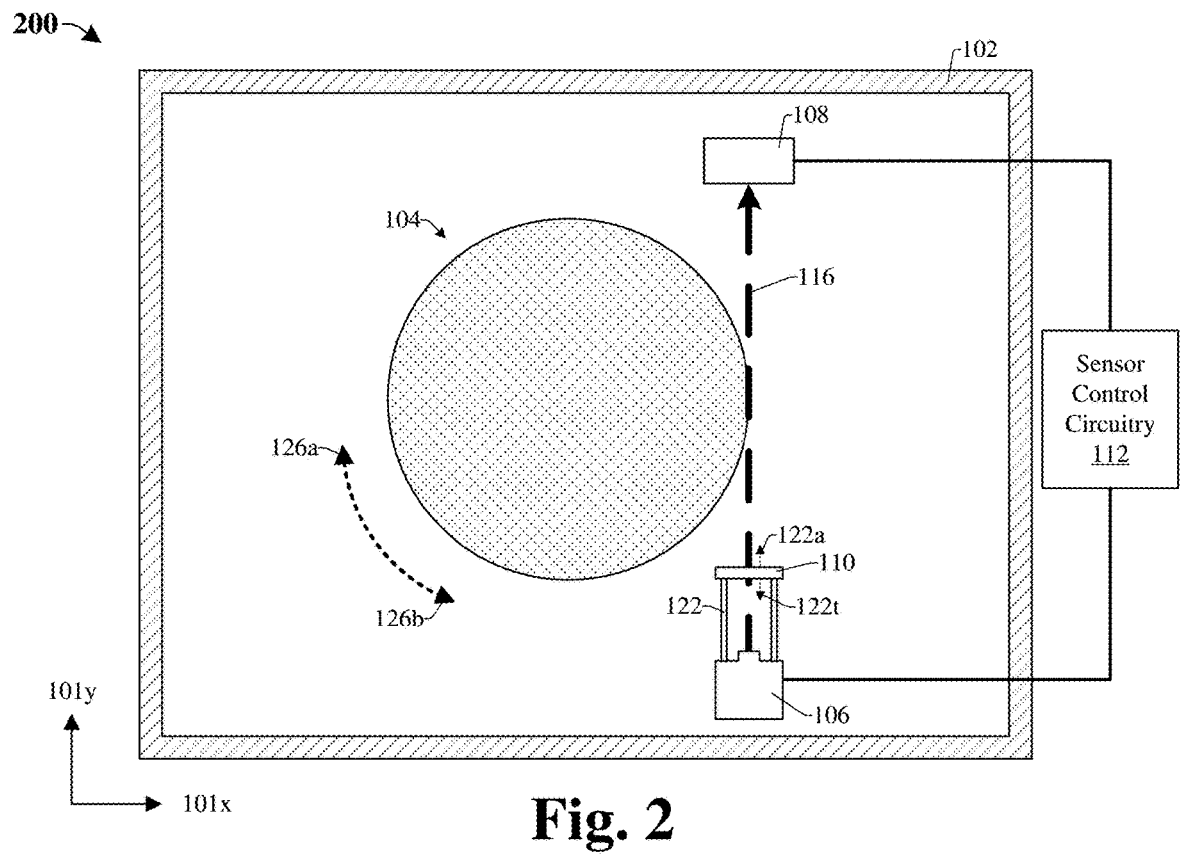
FIG. 2 illustrates a top view of some embodiments of a process tool comprising a radiation source, a radiation sensor, and sensor control circuitry.

FIG. 2 illustrates a top view 200 of some embodiments of a process tool comprising a radiation source 106, a radiation sensor 108, and sensor control circuitry 112. In some embodiments, the process tool illustrated in the top view 200 of FIG. 2 corresponds to the process tool illustrated in the cross-sectional view 100 of FIG. 1. In some embodiments, FIG. 2 is illustrated in an y-x plane (e.g., extending along axes 101y and 101x).

In some embodiments, the electromagnetic radiation 116 is generated along a path that extends between the radiation source 106 and the radiation sensor 108 and that is substantially tangent to a perimeter of the pair of bonded workpieces 104.

In some embodiments, the sensor control circuitry 112 is further configured to determine a volume of an underfill material (not shown) that exists along an interface between the pair of bonded workpieces 104. For example, in some embodiments, the radiation source 106 generates a first beam of electromagnetic radiation 116 that is directed toward a perimeter of the interface 128 between the pair of bonded workpieces 104. The radiation sensor 108 measures a first radiation intensity of the first beam of electromagnetic radiation 116 that makes it past the perimeter of the interface 128. An underfill is deposited along the perimeter of the interface between the pair of bonded workpieces 104. The radiation source 106 generates a second beam of electromagnetic radiation 116 that is directed toward the underfill that is along the perimeter of the interface 128. The radiation sensor 108 measures a second radiation intensity of the second beam of electromagnetic radiation 116 that makes it past the underfill along the perimeter of the interface 128. The sensor control circuitry 112 determines a volume of the underfill that exists along the interface 128 based on a difference between the first measured radiation intensity and the second measured radiation intensity (see, for example, FIGS. 8-16 and FIG. 17).

In some embodiments, the sensor control circuitry 112 is further configured to determine a position of the underfill material. For example, in some embodiments, the radiation source 106 generates a first beam of electromagnetic radiation 116 that is directed toward a perimeter of the interface 128. The radiation sensor 108 measures a first radiation intensity of the first beam of electromagnetic radiation that makes it past the perimeter of the interface 128. The radiation source 106 generates a second beam of electromagnetic radiation 116 that is directed toward the perimeter of the interface 128, the second beam having a different beam size than the first beam. The radiation sensor 108 measures a second radiation intensity of the second beam of electromagnetic radiation 116 that makes it past the perimeter of the interface 128. The sensor control circuitry 112 determines a position of underfill that exists along the interface 128 based on the first measured radiation intensity and the second measured radiation intensity (see, for example, FIGS. 18-22 and FIG. 23).

Figure 3:
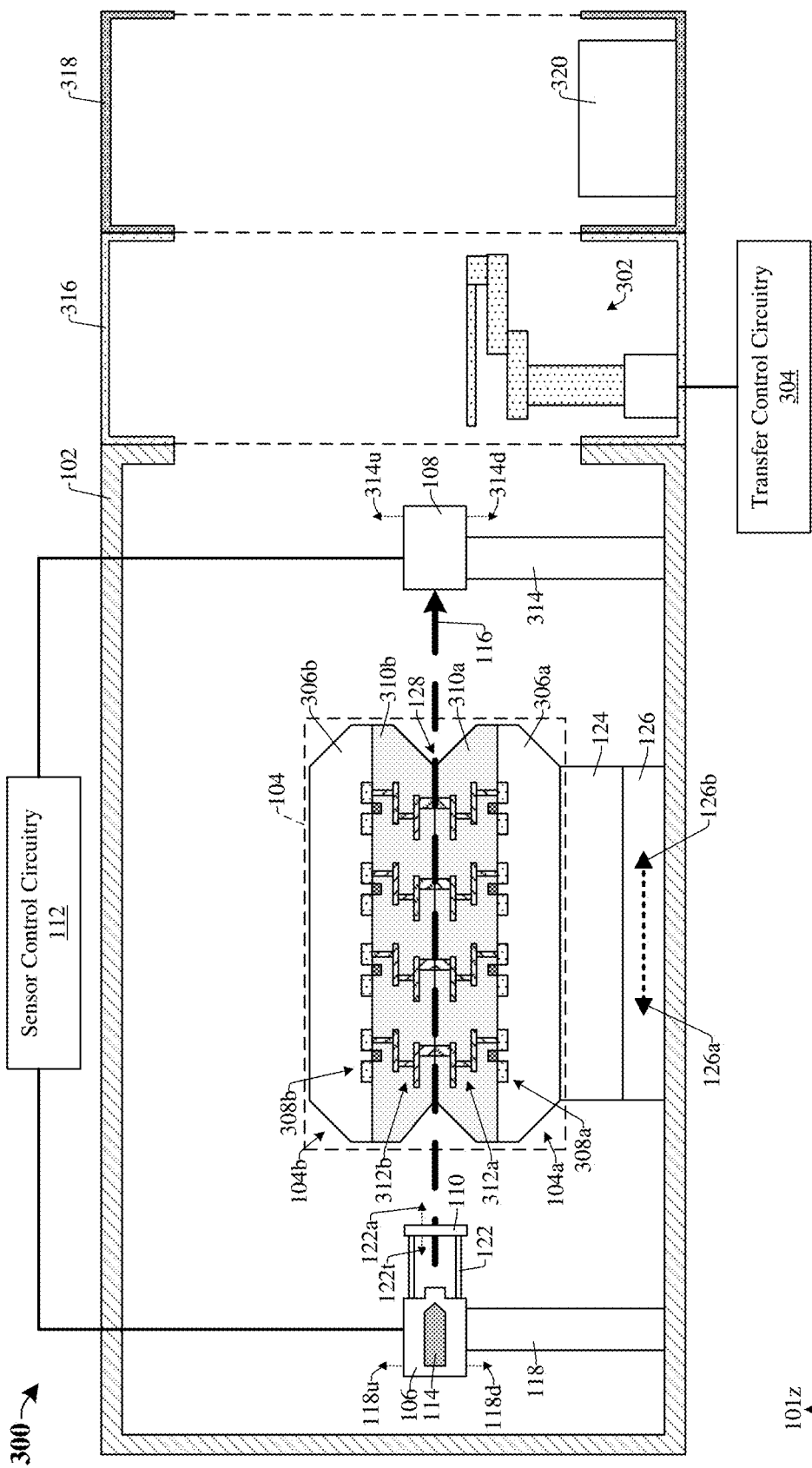
FIG. 3 illustrates a cross-sectional view of some embodiments of a process tool comprising a transfer robot and transfer control circuitry.

FIG. 3 illustrates a cross-sectional view 300 of some embodiments of a process tool comprising a transfer robot 302 and transfer control circuitry 304.

In some embodiments, the transfer robot 302 is arranged in a transfer chamber 316 (e.g., a factory interface). In some embodiments, the transfer control circuitry 304 is configured to control the transfer robot 302. For example, the transfer control circuitry 304 may instruct the transfer robot 302 to move bonded workpieces 104 into and/or out of the process chamber 102 for further processing.

In some embodiments, the process tool further comprises a load port 318 coupled to the transfer chamber 316. In some embodiments, the load port 318 may be configured to receive a carrier 320 holding one or more workpieces (e.g., bonded workpieces 104). In various embodiments, the carrier 320 may comprise a FOUP (a front opening unified pod), a wafer cassette, or the like. The transfer robot 302 may be configured to transfer the workpieces from the carrier 320 to the process chamber 102

Further, in some embodiments, the bonded workpieces 104 may, for example, comprise a first workpiece 104a and a second workpiece 104b bonded to the first workpiece 104a. In some embodiments, the first workpiece 104a may, for example, comprise a first substrate 306a, a first plurality of semiconductor devices 308a arranged within and/or along the first substrate 306a, a first dielectric structure 310a over the first substrate 306a, and a first interconnect structure 312a within the first dielectric structure 310a.

Similarly, in some embodiments, the second workpiece 104b may, for example, comprise a second substrate 306b, a second plurality of semiconductor devices 308b arranged within and/or along the second substrate 306b, a second dielectric structure 310b over the second substrate 306b, and a second interconnect structure 312b within the second dielectric structure 310b. In some embodiments, the second workpiece 104b may be upside-down relative to the first workpiece 104a (e.g., such that the second substrate 306b is over the second interconnect structure 312b).

Furthermore, in some embodiments, the radiation sensor 108 is arranged on a third actuator device 314 that is configured to move the radiation sensor 108 up (e.g., 314u) and down (e.g., 314d) along the vertical axis 101z. In some embodiments, the first actuator device 118 and the third actuator device 314 are configured to move together in a synchronized fashion (e.g., such that the radiation source 106 and the radiation sensor 108 remain at a same or similar height along the vertical axis 101z).

In some embodiments, the pair of bonded workpieces 104 (e.g., the first workpiece 104a and the second workpiece 104b) may be a pair of bonded wafers (e.g., a first wafer and a second wafer), a pair of bonded substrates, or the like. In some embodiments, the wafer chuck 124 may alternatively be referred to as a workpiece holder structure. In some embodiments, the rotor device 126 may, for example, be or comprise a motorized spinning rotor or some other suitable device.

In some embodiments, a deposition device 114 is attached to the radiation source 106. In some other embodiments, the deposition device 114 is adjacent to the radiation source 106 and is spaced apart from the radiation source 106. The deposition device 114 is configured to deposit one or more materials (e.g., an underfill or the like) on one or more surfaces of the pair of bonded workpieces 104.

In some embodiments, the radiation source 106 may, for example, be or comprise a laser, a light emitting diode, or some other suitable device. In some embodiments, the radiation sensor 108 may, for example, be or comprise a photodiode, a phototransistor, some other photodetector, a complementary metal-oxide-semiconductor (CMOS) image sensor, or some other suitable device.

In some embodiments, first actuator device 118, the second actuator device 122, and/or the third actuator device 314 may, for example, be motorized actuators, some other motorized arm, some robotic arm, or some other suitable device. In some embodiments, first actuator device 118, the second actuator device 122, and/or the third actuator device 314 may comprise stepping motors or some other step-capable device that is configured to step through different discrete positions. In some embodiments, the optical assembly 110 may, for example, be or comprise a focusing lens that is capable of producing a gaussian beam (e.g., a beam with an intensity distribution that is the same or similar to a gaussian distribution), some other suitable lens, or some other suitable device.

In some embodiments, the deposition device 114 may, for example, be or comprise a jet valve, some micro dispensing valve, some other dispensing valve, or some other suitable deposition device.

Figure 4:
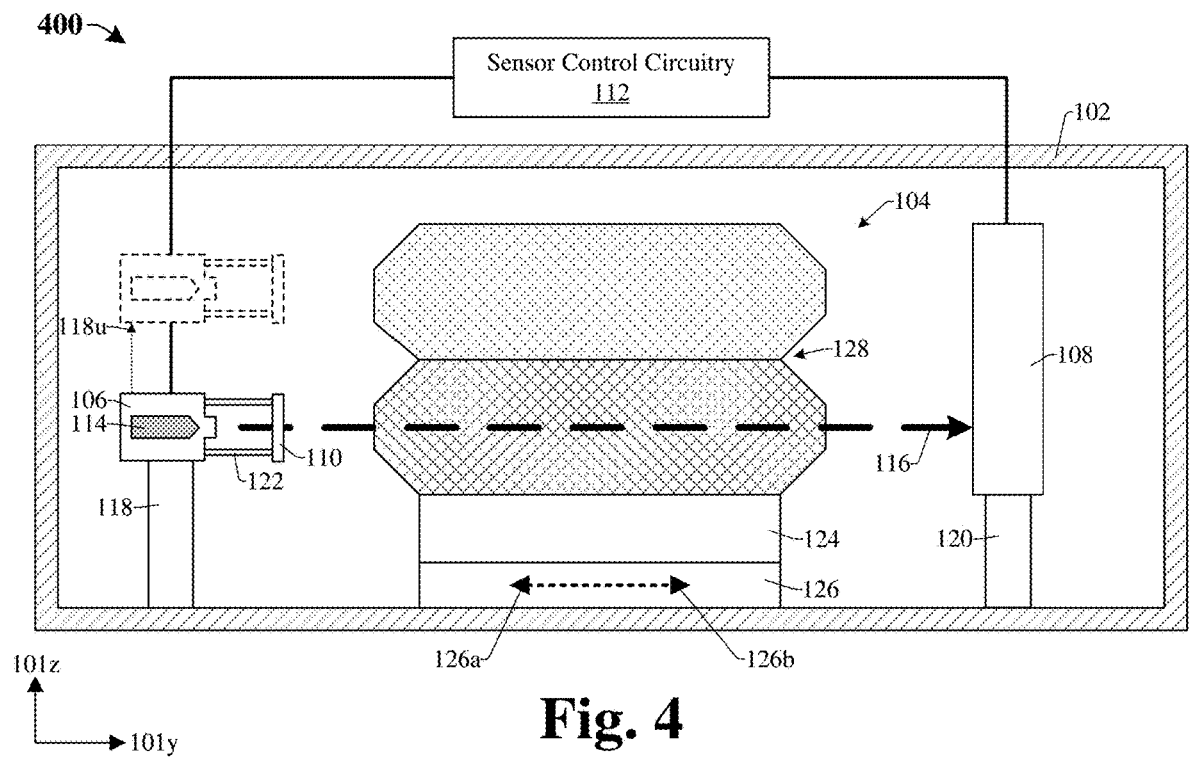
Figure 5:
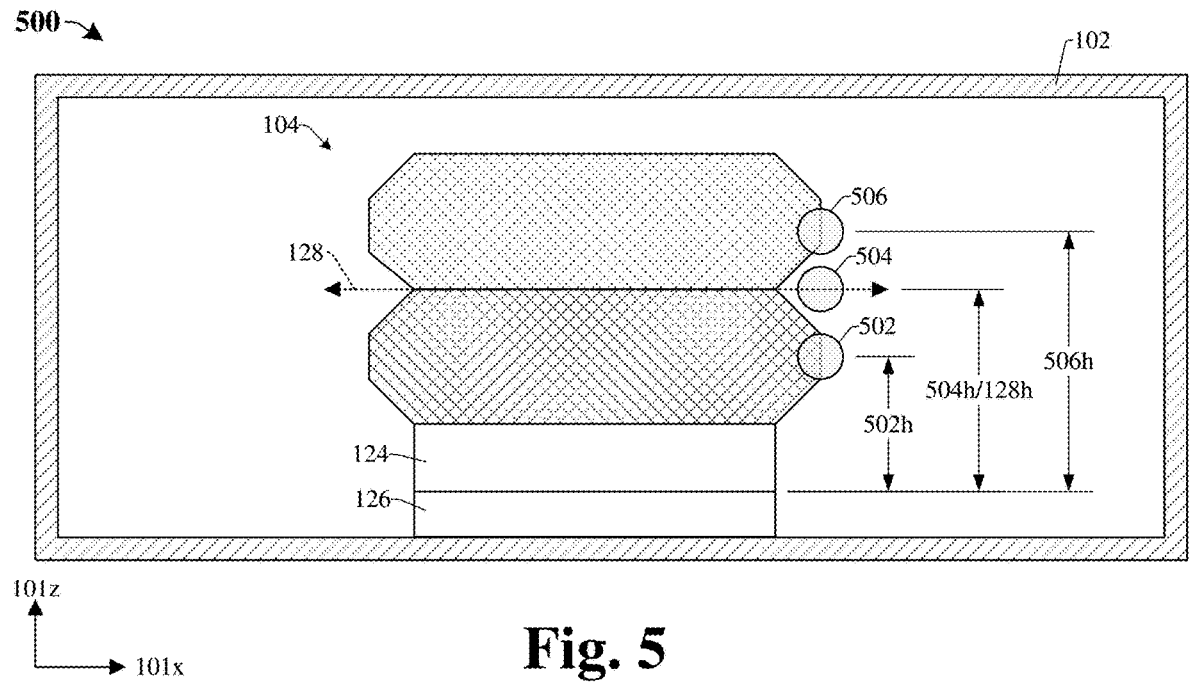

FIGS. 4-6 illustrate some embodiments of a method for determining a position of an interface between a pair of bonded workpieces. Although FIGS. 4-6 are described in relation to a method, it will be appreciated that the structures disclosed in FIGS. 4-6 are not limited to such a method, but instead may stand alone as structures independent of the method.

As shown in cross-sectional view 400 of FIG. 4, a pair of bonded workpieces 104 are transferred into a process chamber 102. The pair of bonded workpieces 104 are placed in the process chamber 102 (e.g., such that a straight line between the radiation source 106 and the radiation sensor 108 is tangent to a perimeter of the pair of bonded workpieces 104). In some embodiments, a transfer robot (e.g., 302 of FIG. 3) transfers the bonded workpieces 104 into the process chamber 102.

A radiation source 106 then generates electromagnetic radiation 116 that is directed toward a perimeter of the pair of bonded workpieces 104 and toward a radiation sensor 108 that is arranged behind the perimeter of the pair of bonded workpieces 104 and that is in the path of the electromagnetic radiation 116. The radiation source 106 scans along a vertical axis 101z while generating the electromagnetic radiation 116. In some embodiments, the scanning may comprise positioning the radiation source 106 at a plurality of different positions. In some embodiments, the first actuator device 118 moves the radiation source upwards (e.g., 118u) throughout the scan, starting from below the interface 128 and moving to above the interface 128. In some embodiments, the first actuator moves the radiation source 106 upward throughout the scan. In some alternative embodiments, the first actuator device 118 alternatively moves the radiation source 106 downwards (e.g., 118d of FIG. 1) throughout the scan, starting from above the interface 128 and moving to below the interface 128. In some other alternative embodiments, the radiation source 106 has a fixed vertical position, and instead is tilted to scan along the vertical axis 101z. In some embodiments, the radiation sensor 108 is stationary throughout the scan. In some alternative embodiments, the sensor is moved along the vertical axis 101z with the radiation source 106 by a third actuator (e.g., 314 of FIG. 3).

As shown in cross-sectional view 500 of FIG. 5, the scanning causes the electromagnetic radiation 116 to move over a plurality of different positions (e.g., 502h, 504h, and 506h) along a vertical axis by way of a first actuator device 118.

For example, in some embodiments, the electromagnetic radiation 116 is generated to pass by the pair of bonded workpieces 104 at the first height 502h, as illustrated by a first radiation beam cross-section 502. In such embodiments, the electromagnetic radiation 116 is then moved upward to a second height 504h along the vertical axis 101z, as illustrated by a second radiation beam cross-section 504. In such embodiments, the electromagnetic radiation 116 is then moved upward to a third height 506h along the vertical axis 101z as illustrated by a third radiation beam cross-section 506.

The radiation sensor 108 measures an intensity of the electromagnetic radiation 116 that impinges on the radiation sensor 108 throughout the scanning. FIG. 6 illustrates a graph 600 showing some exemplary values of the electromagnetic radiation 116 at different positions. In some embodiments, measuring the intensity comprises recording a plurality of discrete radiation intensity values (e.g., 602, 604, and 606) that correspond to respective positions (e.g., 502h, 504h, and 506 of FIG. 5) of the plurality of positions along the vertical axis 101z. For example, when the electromagnetic radiation 116 is positioned at the first height (502h of FIG. 5), as illustrated by the first radiation beam cross-section 502 of FIG. 5, the measured radiation intensity is quantified by a first radiation intensity value 602. When the electromagnetic radiation 116 is positioned at the second height (504h of FIG. 5), as illustrated by the second radiation beam cross-section 504 of FIG. 5, the measured radiation intensity is quantified by a second radiation intensity value 604. When the electromagnetic radiation 116 is positioned at the third height (506h of FIG. 5), as illustrated by the third radiation beam cross-section 506 of FIG. 5, the measured radiation intensity is quantified by a third radiation intensity value 606. In some embodiments, the pair of bonded workpieces 104 are rotated clockwise or counterclockwise throughout the measurement of the electromagnetic radiation 116.

A position of an interface 128 (e.g., a height 128h of the interface 128) between the pair of bonded workpieces 104 is determined, by sensor control circuitry 112, based on the position (e.g., 504h of FIG. 5) along the vertical axis 101z that corresponds with a maximum measured radiation intensity value (e.g., 604). For example, because the maximum measured radiation intensity value was measured at the second height (504h of FIG. 5), the sensor control circuitry 112 determines that the height 128h of the interface 128 (e.g., the position of the interface 128) is equal to the second height (504h of FIG. 5).

Although the above example describes the radiation source 106 generating electromagnetic radiation at three discrete heights and determining the position of the interface based on the corresponding intensity values measured at the three discrete heights, it will be appreciated that in some embodiments, the radiation source 106 may alternatively generate the electromagnetic radiation at another number of discrete heights (e.g., four, five, six, seven, and so on), or the radiation source 106 may alternatively generate the electromagnetic radiation in a continuous fashion along the vertical axis 101z (e.g., as shown by the black data line in FIG. 6).

FIG. 7 illustrates a flow diagram of some embodiments of a method 700 for determining a position of an interface between a pair of bonded workpieces. While the disclosed methods (e.g., method 700, method 1700, and/or method 2300) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 702, electromagnetic radiation is generated toward a perimeter of a pair of bonded workpieces. FIG. 4 illustrates a cross-sectional view 400 of some embodiments corresponding to act 702.

At 704, the electromagnetic radiation is scanned along a vertical axis. FIGS. 4 and 5 illustrate cross-sectional views 400 and 500 of some embodiments corresponding to act 704.

At 706, an intensity of the electromagnetic radiation that makes it past the perimeter of the pair of bonded workpieces is measured throughout the scanning. FIG. 6 illustrates a graph 600 corresponding to act 706.

At 708, a position of an interface between the pair of bonded workpieces is determined based on the position along the vertical axis that corresponds with a maximum measured intensity of the electromagnetic radiation. FIGS. 4-6 illustrate some embodiments corresponding to act 708.

In some embodiments, the pair of bonded workpieces are continuously rotated clockwise or counterclockwise during one or more acts of the method 700.

FIGS. 8-16 illustrate some embodiments of a method for determining a volume of an underfill that is formed along an interface 128 between a pair of bonded workpieces 104. Although FIGS. 8-16 are described in relation to a method, it will be appreciated that the structures disclosed in FIGS. 8-16 are not limited to such a method, but instead may stand alone as structures independent of the method.

Figure 8:
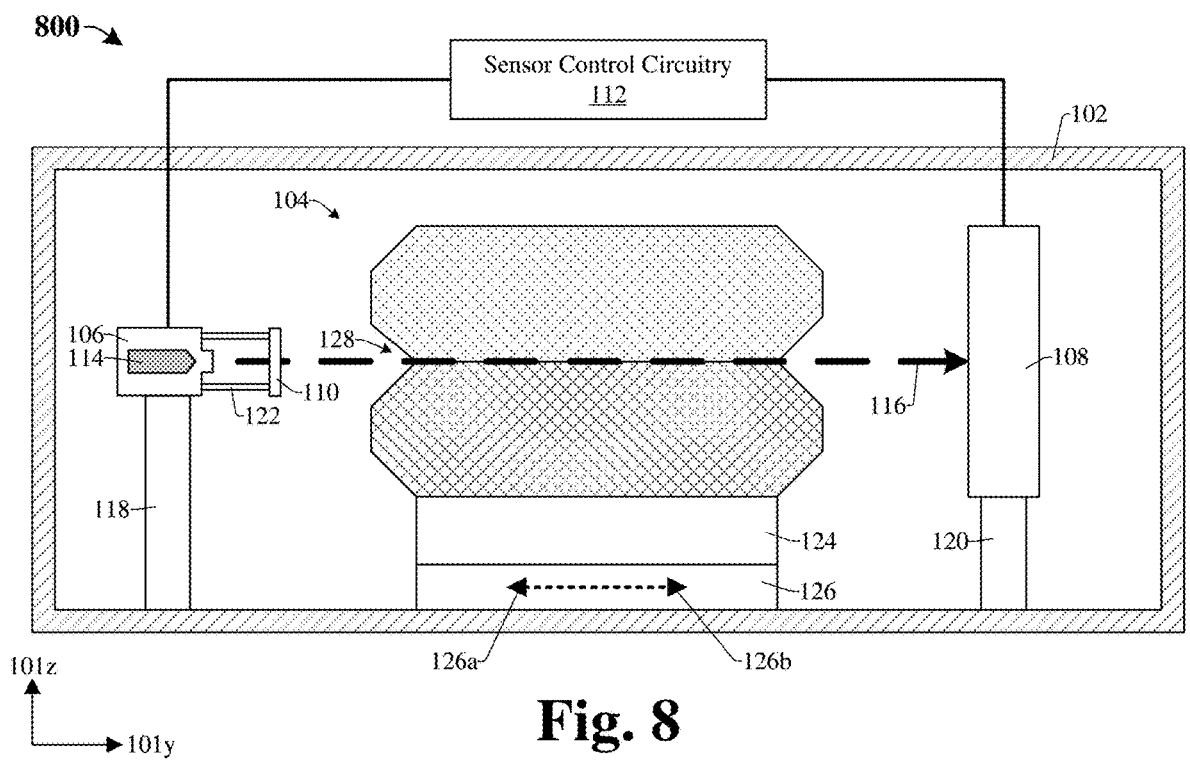
FIGS. 8-16 illustrate figures corresponding to some embodiments of a method for determining a volume of an underfill that is formed along an interface between a pair of bonded workpieces.

As shown in cross-sectional view 800 of FIG. 8, a position of an interface 128 between a pair of bonded workpieces 104 is determined. In some embodiments, the position of the interface 128 may be determined using the method illustrated in FIGS. 4-6. In some other embodiments, the position of the interface 128 may already be known by sensor control circuitry 112.

Figure 9:
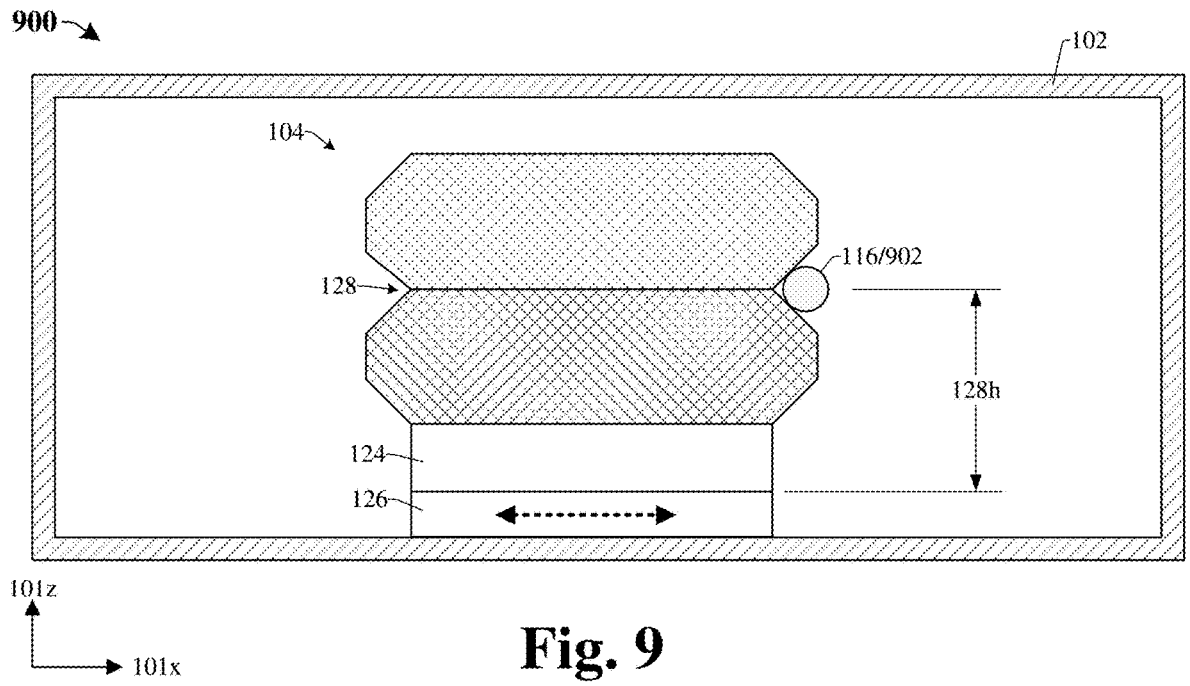

As shown in cross-sectional view 900 of FIG. 9, a radiation source (e.g., 106 of FIG. 8) generates a first beam 902 of electromagnetic radiation 116 that is directed toward a perimeter of the interface 128 between the pair of bonded workpieces 104 and toward a radiation sensor (e.g., 108 of FIG. 8) that is arranged behind the perimeter of the interface 128. The first beam 902 of electromagnetic radiation 116 is generated at the height 128h of the interface 128. The radiation sensor measures a first radiation intensity value of the first beam 902 of electromagnetic radiation 116 that impinges on the radiation sensor (e.g., that makes it past the perimeter of the interface 128).

Figure 10:
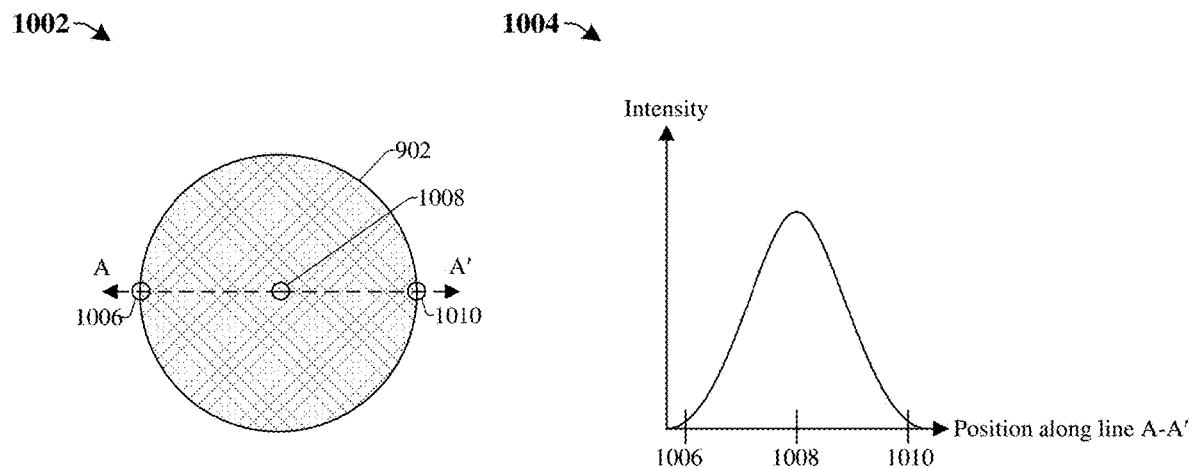

The sensor control circuitry (e.g., 112 of FIG. 8) then analyzes the first radiation intensity value. FIG. 10 illustrates an image 1002 of the first beam 902 as recorded by the radiation sensor. As seen in the image 1002, approximately the entirety of the first beam 902 impinged on the radiation sensor. This can also be seen in the graph 1004 which charts measured electromagnetic radiation intensity versus position along a line A-A' that is overlaid on the image 1002 of the first beam 902. In the graph 1004, it can be seen that the intensity is lower around the perimeter of the first beam 902 (e.g., at points 1006 and 1010 along line A-A') while the intensity is higher around the center of the first beam 902 (e.g., at point 1008 along line A-A'). This is consistent with the properties of a gaussian beam.

Figure 11:
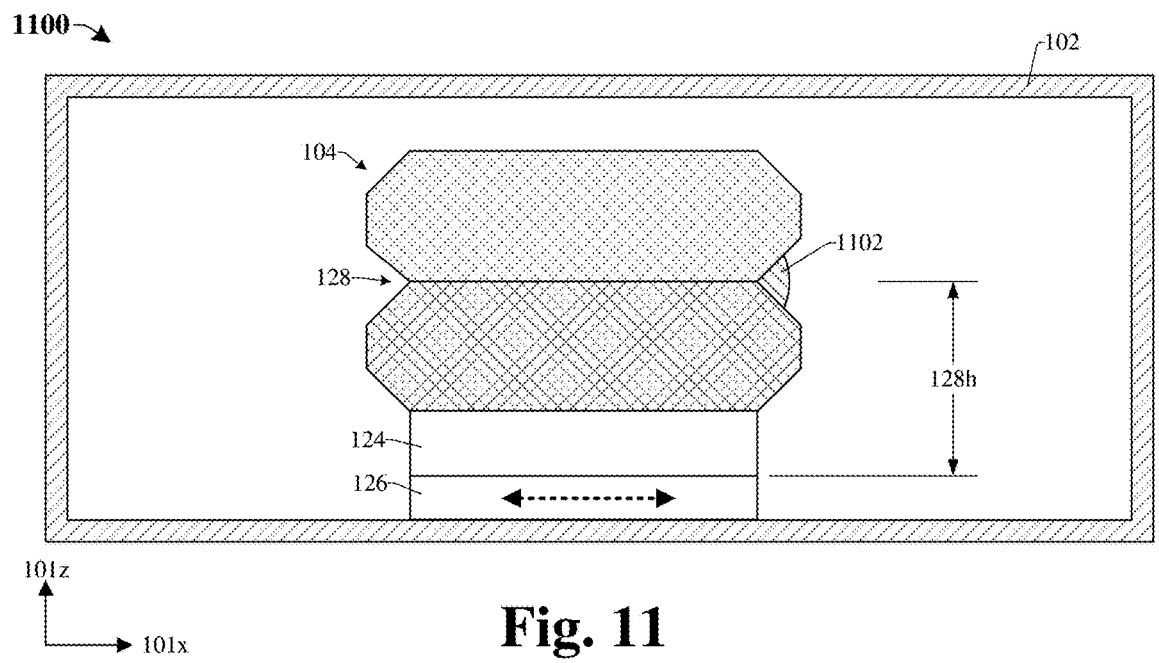

As shown in cross-sectional view 1100 of FIG. 11, a first layer of underfill 1102 is formed in a closed path along the perimeter of the interface 128 between the pair of bonded workpieces 104. In some embodiments, the first layer of underfill 1102 is formed by depositing an epoxy or some other suitable material(s) along the perimeter of the interface 128 using a deposition device (e.g., 114 of FIG. 8). In some embodiments, the deposition device may dispense the first layer of underfill 1102 through a valve controlled nozzle that may deposit the underfill in small droplets and in a contactless manner (e.g., the deposition device may not come into contact with the pair of bonded workpieces 104).

Figure 12:
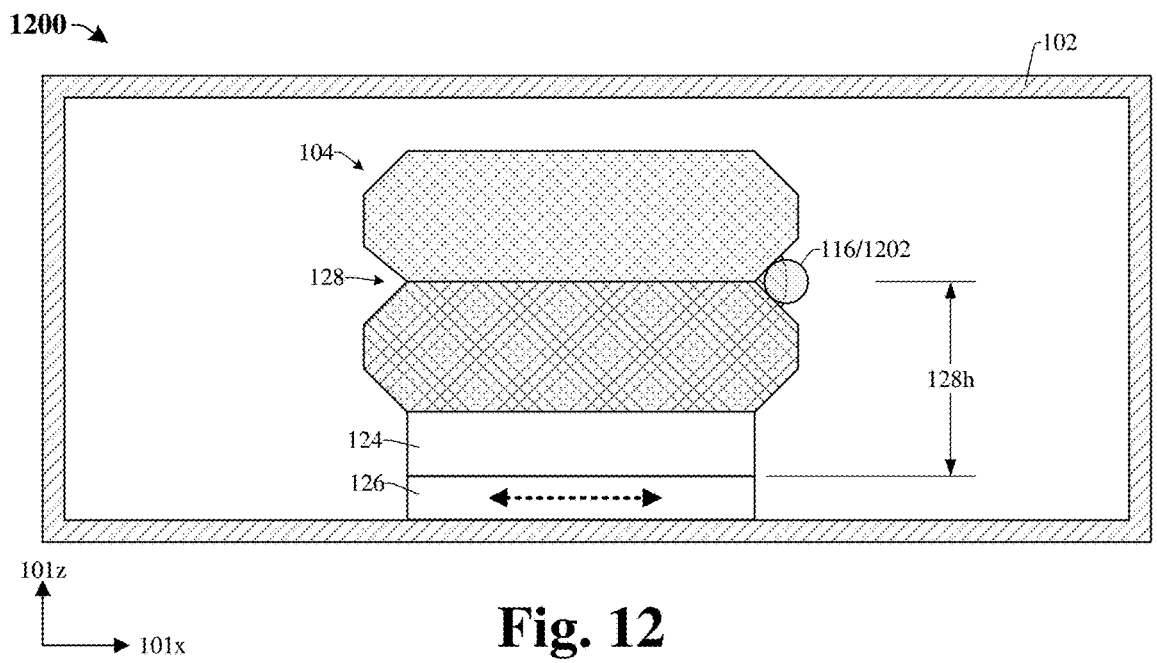

As shown in cross-sectional view 1100 of FIG. 12, the radiation source generates a second beam 1202 of electromagnetic radiation 116 that is directed toward the perimeter of the interface 128 and toward the radiation sensor. Further, the radiation sensor measures a second radiation intensity value of the second beam 1202 of electromagnetic radiation 116 that impinges on the radiation sensor.

Figure 13:
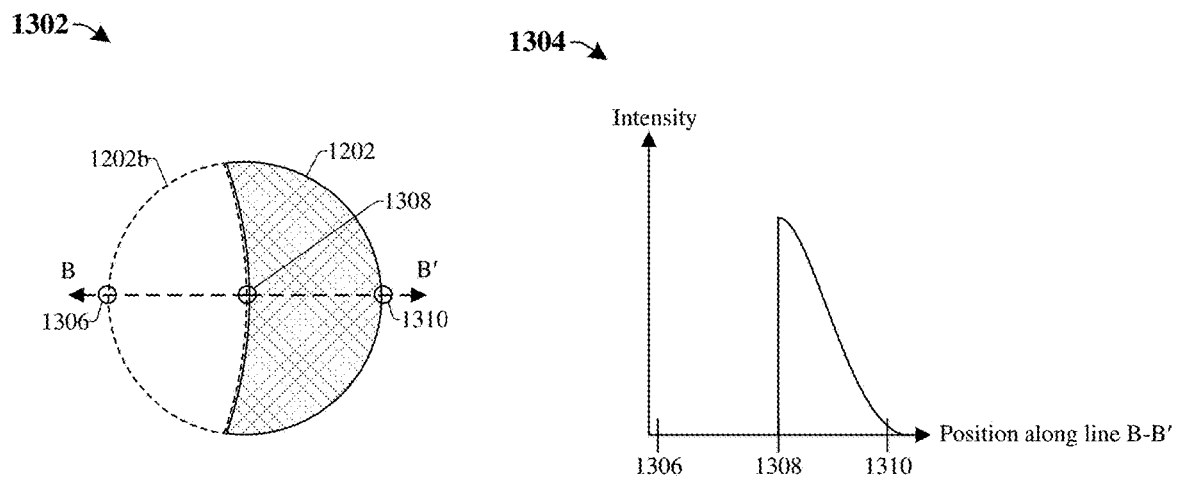

The sensor control circuitry then analyzes the second radiation intensity value. FIG. 13 illustrates an image 1302 of the second beam 1202 as recorded by the radiation sensor. As seen in the image 1302, a portion (e.g., 1202b) of the second beam 1202 has not impinged on the radiation sensor (e.g., has been blocked from the radiation sensor), while another portion of the second beam 1202 (e.g., illustrated by the shaded portion) has impinged on the radiation sensor. This can also be seen in the graph 1304 which charts measured electromagnetic radiation intensity versus position along a line B-B' that is overlaid on the image 1302 of the second beam 1202. In the graph 1304, it can be seen that the intensity is approximately zero throughout the portion (e.g., 1202b) of the second beam 1202 that has not impinged on the radiation sensor (e.g., at point 1306 along line B-B'), while the intensity is greater than zero is throughout the portion of the second beam 1202 that has impinged on the radiation sensor (e.g., at points 1308 and 1310 along line B-B').

The sensor control circuitry then determines a first volume of the first layer of underfill 1102 based on a difference between the first measured radiation intensity and the second measured radiation intensity. In some embodiments, the sensor control circuitry may compare the area of the radiation sensor that sensed electromagnetic radiation during the generation of the first beam 902 (i.e., a first beam-received area) to the area of the radiation sensor that sensed electromagnetic radiation during the generation of the second beam 1202 (i.e., a second beam-received area) to determine the volume of the first layer of underfill 1102. For example, in such embodiments, the sensor control circuitry may subtract the latter area from the former area. In some embodiments, the determination may employ an integral analysis of the first measured intensity and second measured intensity (e.g., may integrate intensity data recorded during the generation of the first beam 902 and intensity data recorded during the generation of the second beam 1202), may compare the differences in intensity based on the integral analysis, and may determine the volume of the first layer of underfill 1102 based on the comparison.

In some embodiments, the steps of generating the first beam 902 and measuring the first intensity may be omitted, and the sensor control circuitry may use data from the determination of the position of the interface 128 instead of measuring the first intensity in determining the volume of the first layer of underfill 1102. For example, in such embodiments, the sensor control circuitry may analyze the intensity measured at the interface during the step of determining the position of the interface, and may use that intensity as the first measured radiation intensity in determining the volume of the underfill. In other words, the sensor control circuitry may determine the volume of the first layer of underfill 1102 based on a difference between second measured radiation intensity and the maximum measured radiation intensity recorded during the determination of the position of the interface.

Figure 14:
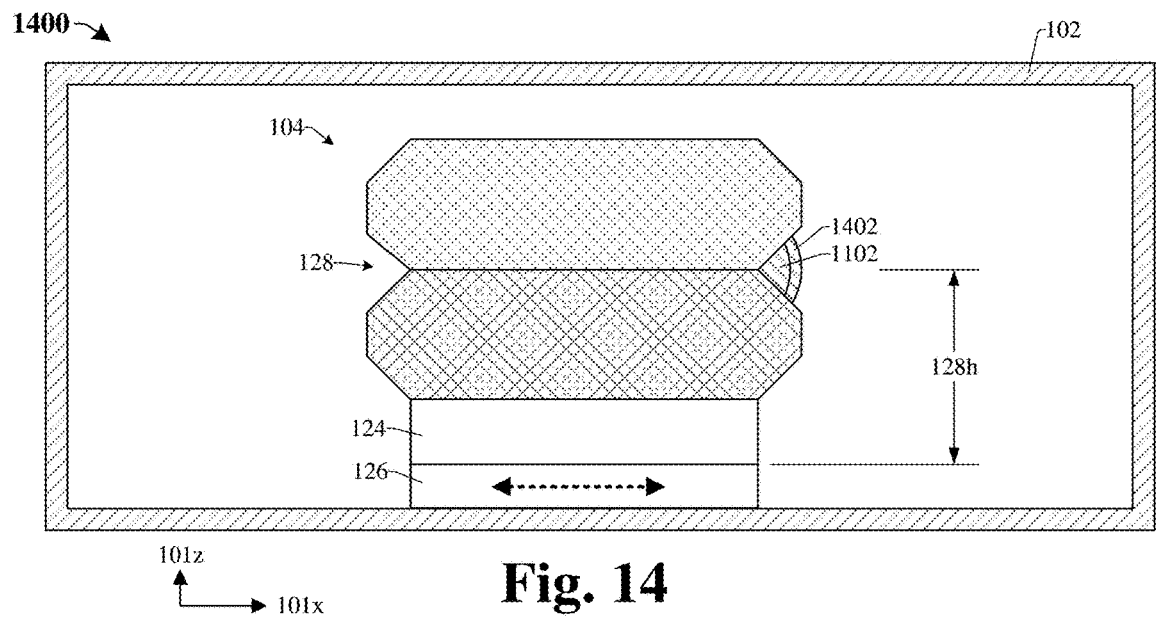
Figure 15:
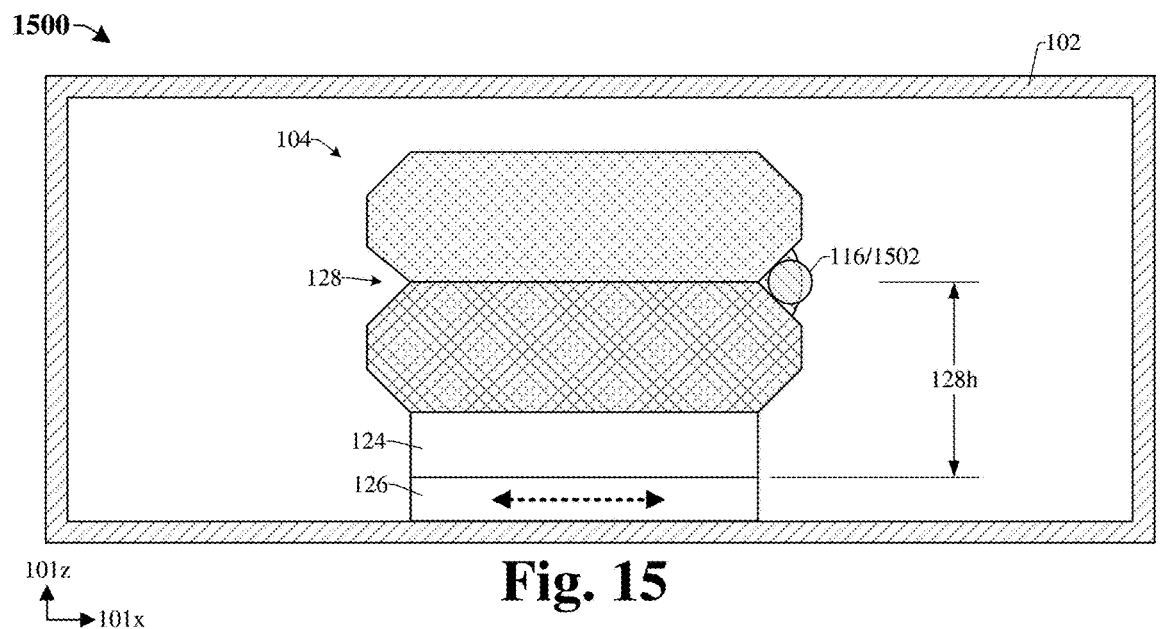
Figure 16:
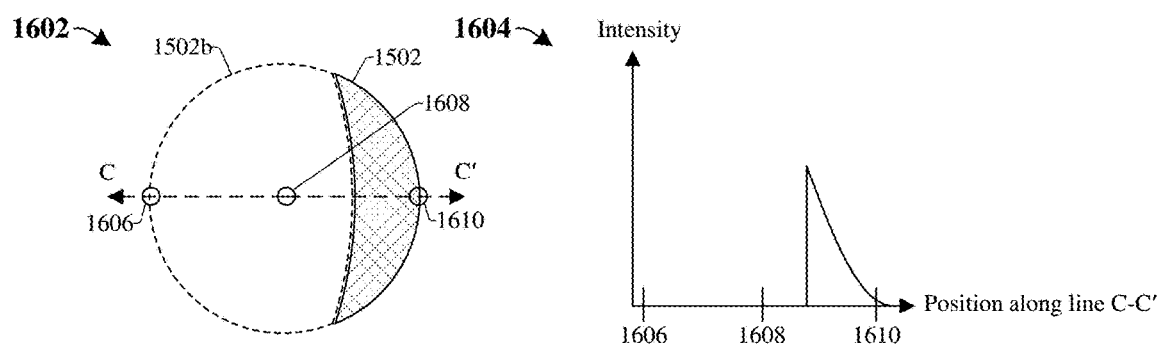

In some embodiments, the aforementioned portion of the method is repeated until a desired underfill volume is reached. For example, in some embodiments, more underfill may be added at the interface 128 and a new volume of the underfill may be determined, as illustrated in FIGS. 14-16. In some embodiments, the volume of the underfill may be equal to the desired volume after a single iteration of the method. In some other embodiments, more than one iteration (e.g., two iterations, three iterations, or more) may be used to reach the desired volume of underfill.

As shown in cross-sectional view 1400 of FIG. 14, a second layer of underfill 1402 is formed in a closed path along the interface 128 and over the first layer of underfill 1102. In some embodiments, the second layer of underfill 1402 is formed by depositing an epoxy or some other suitable material(s) along the perimeter of the interface 128 using the deposition device (e.g., 114 of FIG. 8).

As shown in cross-sectional view 1500 of FIG. 15, the radiation source generates a third beam 1502 of electromagnetic radiation 116 that is directed toward the perimeter of the interface 128 and toward the radiation sensor. Further, the radiation sensor measures a third radiation intensity value of the third beam 1502 of electromagnetic radiation 116 that impinges on the radiation sensor.

The sensor control circuitry then analyzes the third radiation intensity value. FIG. 16 illustrates an image 1602 of the third beam 1502 as recorded by the radiation sensor. As seen in the image 1602, a portion (e.g., 1502*b*) of the third beam 1502 has not impinged on the radiation sensor (e.g., has been blocked from the radiation sensor), while another portion of the third beam 1502 (e.g., illustrated by the shaded portion) has impinged on the radiation sensor. This can also be seen in the graph 1604 which charts measured electromagnetic radiation intensity versus position along a line C-C' that is overlaid on the image 1602 of the third beam 1502. In the graph 1604, it can be seen that the intensity is approximately zero throughout the portion (e.g., 1502*b*) of the third beam 1502 that has not impinged on the radiation sensor (e.g., at points 1606 and 1608 along line C-C'), while the intensity is greater than zero is throughout the portion of the third beam 1502 that has impinged on the radiation sensor (e.g., at point 1610 along line C-C').

The sensor control circuitry then determines a second volume of the first layer of underfill 1102 and the second layer of underfill 1402 combined. In some embodiments, the determination is based on a difference between the first measured radiation intensity and the third measured radiation intensity. In some other embodiments, the determination is based on a difference between the second measured radiation intensity and the third measured radiation intensity. In still other embodiments, the determination is based on a difference between the first measured radiation intensity, the second measured radiation intensity, and the third measured radiation intensity.

In some embodiments, the sensor control circuitry may compare the area of the radiation sensor that sensed electromagnetic radiation during the generation of the first beam 902 to the area of the radiation sensor that sensed electromagnetic radiation during the generation of the third beam 1502 (e.g., may subtract the latter area from the former area) to determine the second volume of the underfill (e.g., 1102 and 1402 combined).

In some embodiments, the determination may employ an integral analysis of the first measured intensity and third measured intensity, may compare the differences in intensity based on the integral analysis, and may determine the second volume based on the comparison.

Figure 17:
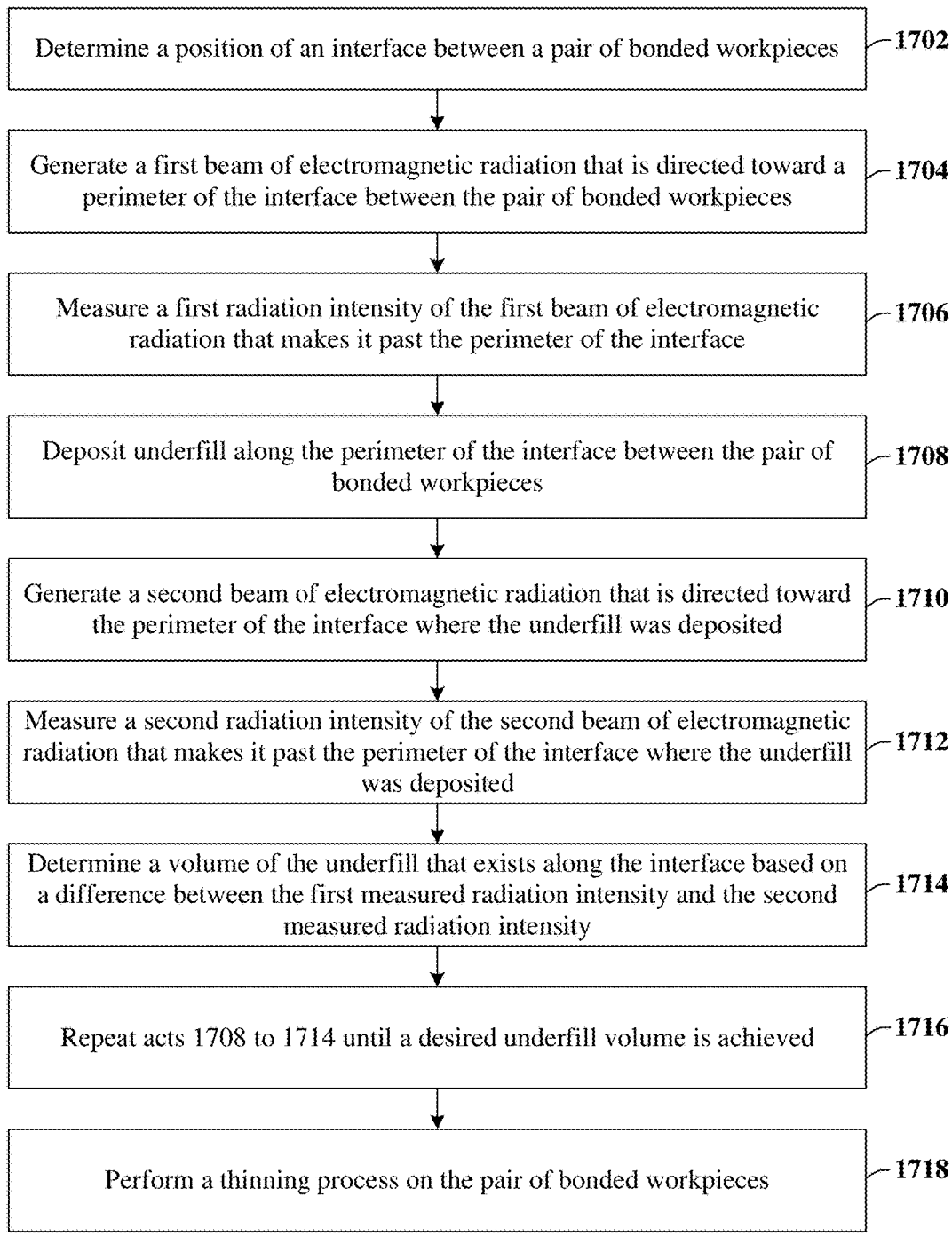
FIG. 17 illustrates a flow diagram of some embodiments of a method for determining a volume of an underfill that is formed along an interface between a pair of bonded workpieces.

FIG. 17 illustrates a flow diagram of some embodiments of a method 1700 for determining a volume of an underfill that is formed along an interface between a pair of bonded workpieces.

At 1702, a position of an interface between a pair of bonded workpieces is determined. FIGS. 4-6 and 8 illustrate some embodiments corresponding to act 1702.

At 1704, a first beam of electromagnetic radiation is generated toward a perimeter of the interface between the pair of bonded workpieces. FIG. 9 illustrates a cross-sectional view 900 of some embodiments corresponding to act 1704.

At 1706, a first radiation intensity of the first beam of electromagnetic radiation that makes it past the perimeter of the interface is measured. FIGS. 9 and 10 illustrate some embodiments corresponding to act 1706.

At 1708, underfill is deposited along the perimeter of the interface between the pair of bonded workpieces. FIG. 11 illustrates a cross-sectional view 1100 of some embodiments corresponding to act 1708.

At 1710, a second beam of electromagnetic radiation is generated toward the perimeter of the interface where the underfill was deposited. FIG. 12 illustrates a cross-sectional view 1200 of some embodiments corresponding to act 1710.

At 1712, a second radiation intensity of the second beam of electromagnetic radiation that makes it past the perimeter of the interface where the underfill was deposited is measured. FIGS. 12 and 13 illustrate some embodiments corresponding to act 1712.

At 1714, a volume of the underfill that exists along the interface is determined based on a difference between the first measured radiation intensity and the second measured radiation intensity. FIG. 13 illustrates some embodiments corresponding to act 1714.

At 1716, acts 1708 to 1714 are repeated until a desired volume of underfill is achieved. FIGS. 14-16 illustrate some embodiments corresponding to act 1716. For example, additional underfill may be deposited along the perimeter of the interface between the pair of bonded workpieces. A third beam of electromagnetic radiation may be generated toward the underfill that is along the perimeter of the interface between the pair of bonded workpieces. A third intensity of the third beam of electromagnetic radiation that makes it past the underfill along the perimeter of the interface is measured. A new volume of the underfill that exist along the interface is determined based on a difference between the first measured intensity and the third measured intensity.

At 1718, a thinning process is performed on the pair of bonded workpieces. For example, the thinning process may be performed on a top workpiece of the pair of bonded workpieces. In some embodiments, the thinning process may comprise a grinding process or the like. For example, in such embodiments, a grind wheel may be applied to the top workpiece of the pair of bonded workpieces to thin the top workpiece. In some embodiments, the underfill deposited at the interface may help prevent peeling of dielectric layers on the pair of bonded workpieces during the thinning process.

In some embodiments, the pair of bonded workpieces are continuously rotated clockwise or counterclockwise during one or more acts of the method 1700.

FIGS. 18-22 illustrate some embodiments of a method for determining a position of an underfill that is formed along an interface 128 between a pair of bonded workpieces 104. Although FIGS. 18-22 are described in relation to a method, it will be appreciated that the structures disclosed in FIGS. 18-22 are not limited to such a method, but instead may stand alone as structures independent of the method.

Figure 18:
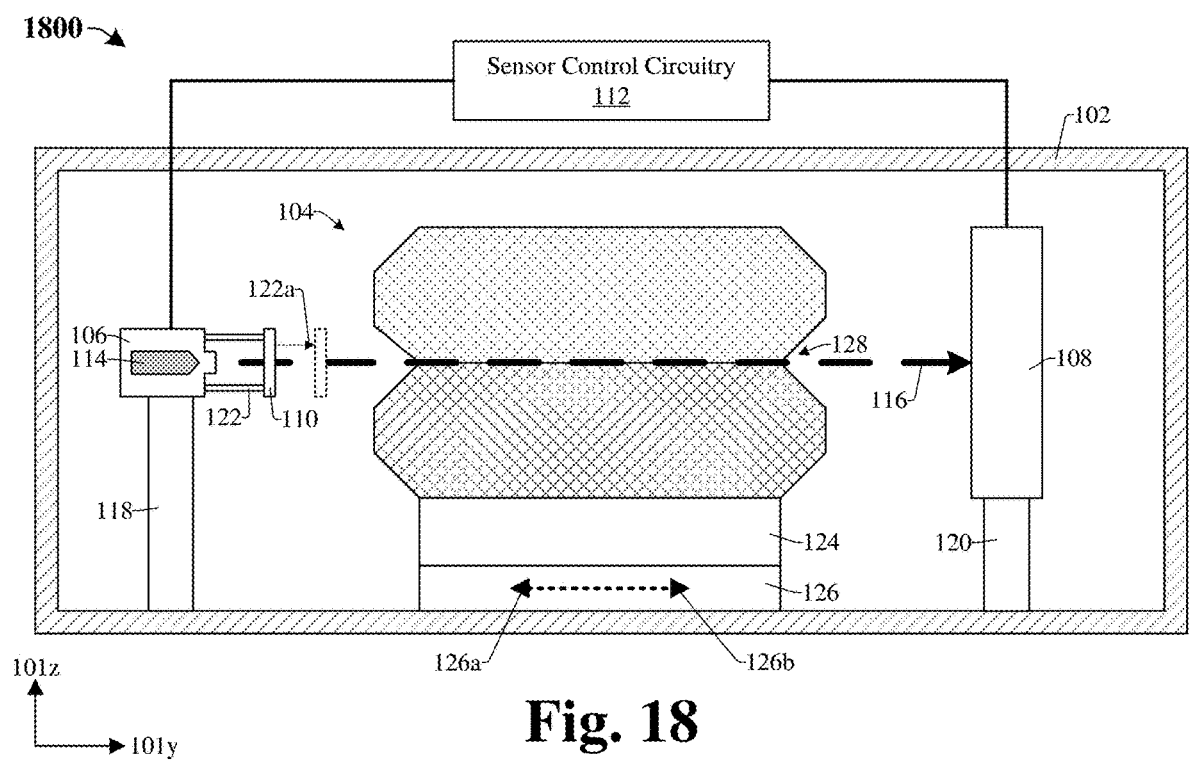

As shown in cross-sectional view 1800 of FIG. 18, a position of an interface 128 between a pair of bonded workpieces 104 is determined. In some embodiments, the position of the interface 128 may be determined using the method illustrated in FIGS. 4-6. In some other embodiments, the position of the interface 128 may already be known by sensor control circuitry 112.

Figure 19:
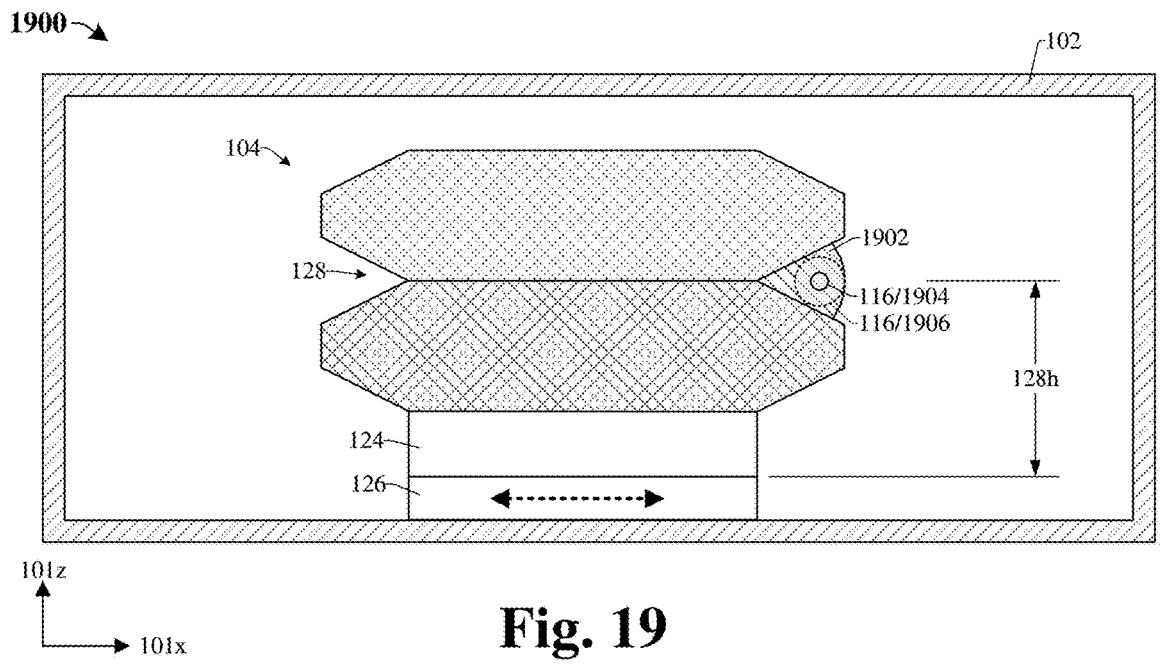
Figure 20:
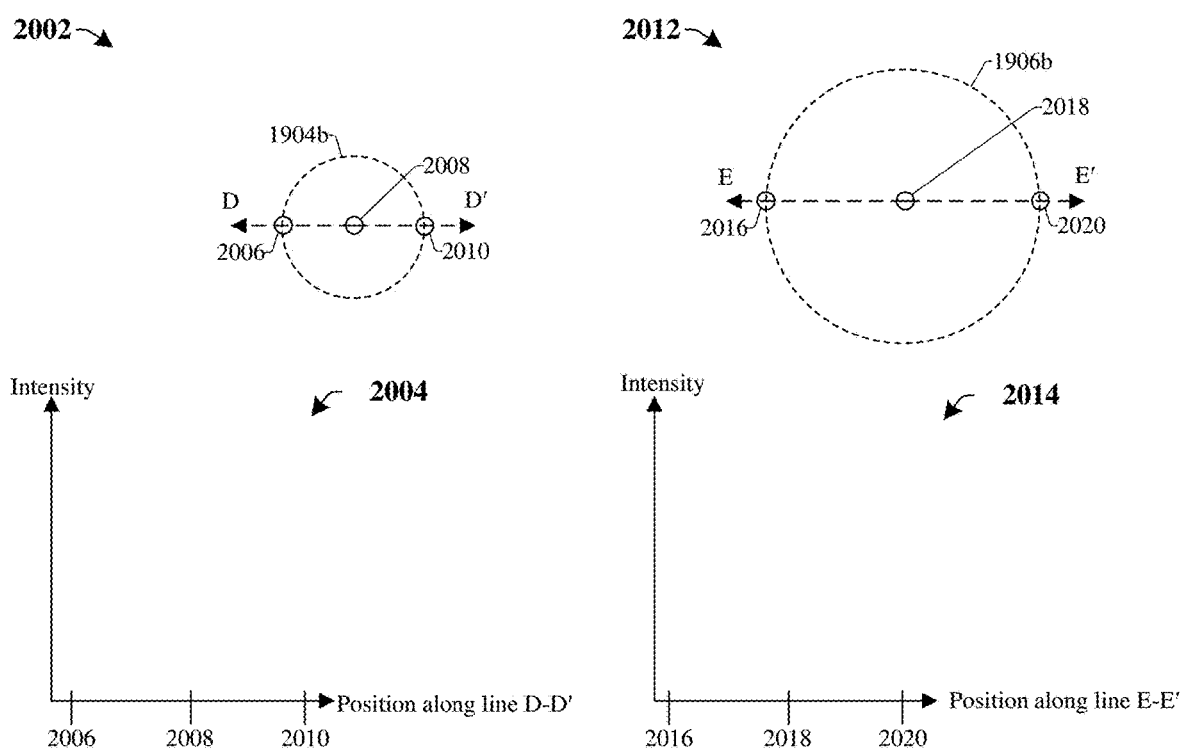

FIGS. 19 and 20 illustrate a first example of the method in which an underfill 1902 is formed along the interface 128.

As shown in cross-sectional view 1900 of FIG. 19, a radiation source (e.g., 106 of FIG. 18) generates a first beam 1904 of electromagnetic radiation 116 that is directed toward a perimeter of the interface 128 between the pair of bonded workpieces 104. A radiation sensor (e.g., 108 of FIG. 18) measures a first radiation intensity of the first beam 1904 of electromagnetic radiation 116 that makes it past the perimeter of the interface 128 and that impinges on the radiation sensor.

The sensor control circuitry (e.g., 112 of FIG. 18) analyzes the first intensity. FIG. 20 illustrates an image 2002 of the first beam 1904 as recorded by the radiation sensor. As seen in the image 2002, approximately the none of the first beam 1904 impinged on the radiation sensor (e.g., as denoted by region 1904*b*). This can also be seen in the graph 2004 which charts measured electromagnetic radiation intensity versus position along a line D-D' that is overlaid on the image 2002 of the first beam 1904. In the graph 2004, it can be seen that the intensity is approximately zero at points 2006, 2008, and 2010 along the line D-D'. This is because the underfill 1902 has blocked approximately the entire first beam 1904 from impinging on the radiation sensor.

The radiation source then generates a second beam 1906 of electromagnetic radiation 116 that is directed toward the perimeter of the interface 128, the second beam 1906 having a different beam size than the first beam 1904 (e.g., the second beam 1906 may have a different radius than the first beam 1904). The radiation sensor measures a second radiation intensity of the second beam 1906 of electromagnetic radiation 116 that makes it past the perimeter of the interface 128.

In some embodiments, the beam size is changed by adjusting a position of an optical assembly (e.g., 110 of FIG. 18) through which the electromagnetic radiation is generated. For example, a second actuator (e.g., 122 of FIG. 18) may move the lens horizontally along a y-axis to adjust the focus of the electromagnetic radiation generated by the radiation source and hence to adjust a size of the beam of electromagnetic radiation.

The sensor control circuitry then analyzes the second intensity. FIG. 20 illustrates an image 2012 of the second beam 1906 as recorded by the radiation sensor. As seen in the image 2012, approximately none of the second beam 1906 impinged on the radiation sensor (e.g., as denoted by region 1906*b*). This can also be seen in the graph 2014 which charts measured electromagnetic radiation intensity versus position along a line E-E' that is overlaid on the image 2012 of the second beam 1906. In the graph 2014, it can be seen that the intensity is approximately zero at points 2016, 2018, and 2020 along the line E-E'. This is because the underfill 1902 has blocked approximately the entire second beam 1906 from impinging on the radiation sensor.

The sensor control circuitry then determines a position of the underfill that exists along the interface 128 based on the first measured radiation intensity and the second measured radiation intensity. For example, because approximately none of the first beam 1904 nor the second beam 1906 impinge on the radiation sensor, the sensor control circuitry may determine that the underfill is indeed positioned at the interface 128 between the pair of bonded workpieces 104. In other words, because the two beams (e.g., 1904 and 1906) are generated toward the perimeter of the interface 128 and because neither of the beams impinge on the radiation sensor, the sensor control circuitry may determine that the underfill must have blocked the beams from the radiation sensor and hence may determine that the underfill is positioned at the interface 128.

FIGS. 21 and 22 illustrate a second example of the method in which the underfill 2102 is not positioned at the interface 128.

As shown in cross-sectional view 2100 of FIG. 21, a radiation source generates a first beam 2104 of electromagnetic radiation 116 that is directed toward a perimeter of the interface 128 between the pair of bonded workpieces 104. A radiation sensor measures a first radiation intensity of the first beam 2104 of electromagnetic radiation 116 that makes it past the perimeter of the interface 128 and that impinges on the radiation sensor.

Sensor control circuitry analyzes the first intensity. FIG. 22 illustrates an image 2202 of the first beam 2104 as recorded by the radiation sensor. As seen in the image 2202, approximately the entirety of the first beam 2104 impinged on the radiation sensor. This can also be seen in the graph 2204 which charts measured electromagnetic radiation intensity versus position along a line F-F' that is overlaid on the image 2202 of the first beam 2104. In the graph 2204, it can be seen that the intensity is greater than zero at points 2206, 2208, and 2210 along the line F-F'. This is because the underfill 2102 has blocked approximately none of the first beam 2104 from impinging on the radiation sensor.

The radiation source then generates a second beam 2106 of electromagnetic radiation 116 that is directed toward the perimeter of the interface 128, the second beam 2106 having a different beam size than the first beam 2104 (e.g., the second beam 2106 may have a different radius than the first beam 2104). The radiation sensor measures a second radiation intensity of the second beam 2106 of electromagnetic radiation 116 that makes it past the perimeter of the interface 128. In some embodiments, the beam size is changed by adjusting a position of a lens (e.g., 110 of FIG. 18) through which the electromagnetic radiation is generated.

The sensor control circuitry then analyzes the second intensity. FIG. 22 illustrates an image 2212 of the second beam 2106 as recorded by the radiation sensor. As seen in the image 2212, a portion of the second beam 2106 impinged on the radiation sensor (e.g., as denoted by the shaded region), while a portion (e.g., 2106*b*) of the second beam 2106 did not impinge on the radiation sensor (e.g., was blocked from the radiation sensor). This can also be seen in the graph 2214 which charts measured electromagnetic radiation intensity versus position along a line G-G' that is overlaid on the image 2212 of the second beam 2106. In the graph 2214, it can be seen that the intensity is approximately zero at point 2216 along the line G-G', while the intensity is greater than zero at points 2218 and 2220 along the line E-E'. This is because the underfill 2102 has blocked a portion of the second beam 2106 from impinging on the radiation sensor.

The sensor control circuitry then determines a position of the underfill 2102 that exists along the interface based on the first measured radiation intensity and the second measured radiation intensity. For example, because approximately all of the first beam 2104 impinged on the radiation sensor, while only a portion of the second beam 2106 impinged on the radiation sensor, the sensor control circuitry may determine that the underfill 2102 is not positioned at the interface 128 between the pair of bonded workpieces 104. In other words, because the two beams (e.g., 1904 and 1906) are generated toward the perimeter of the interface 128 and because the beams produced different intensity measurements, the sensor control circuitry may determine that the underfill 2102 is positioned near the interface but is not positioned at exactly at the interface 128.

Figure 23:
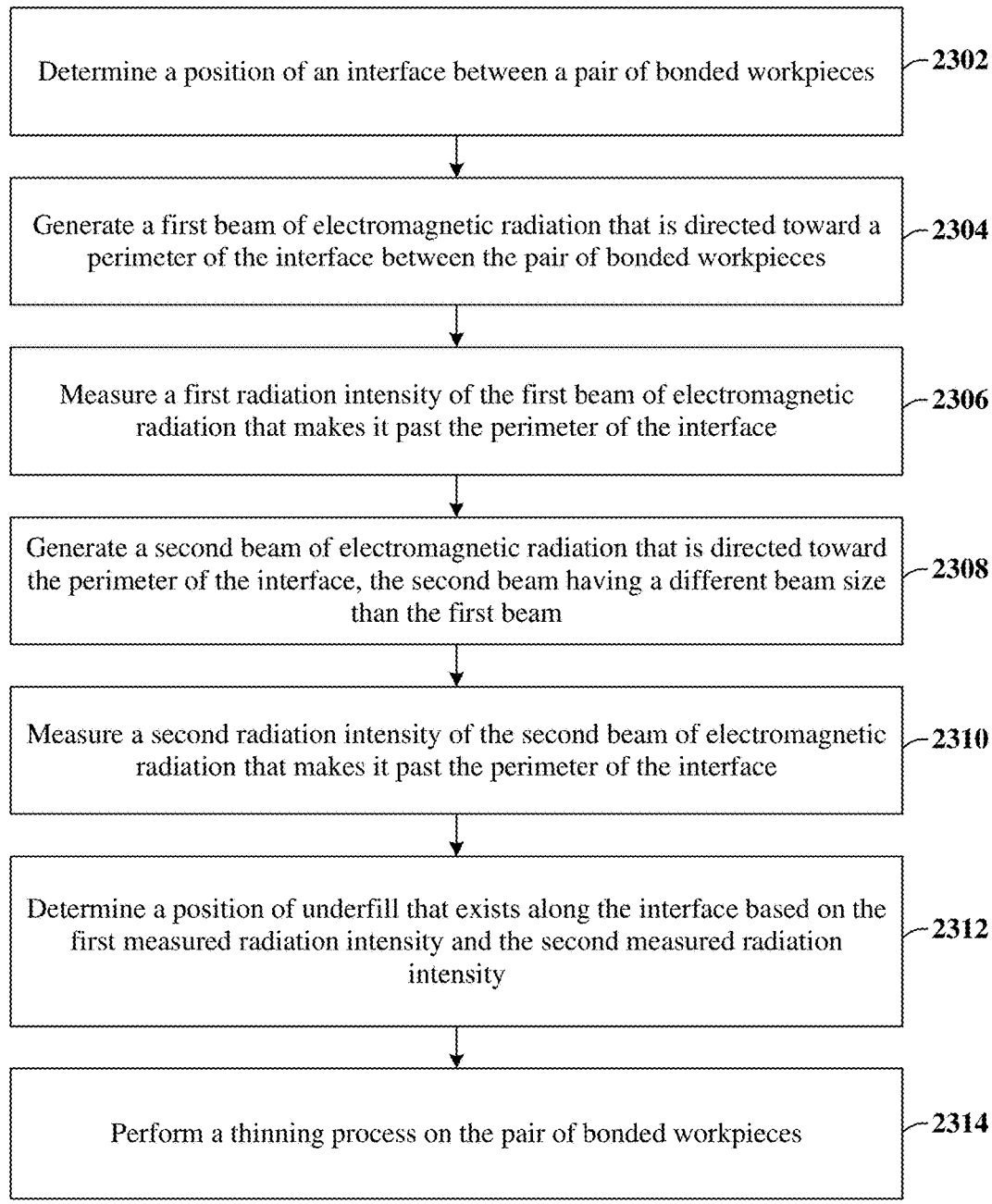
FIG. 23 illustrates a flow diagram of some embodiments of a method for determining a position of an underfill that is formed along an interface between a pair of bonded workpieces

FIG. 23 illustrates a flow diagram of some embodiments of a method 2300 for determining a position of an underfill that is formed along an interface between a pair of bonded workpieces.

At 2302, a position of an interface between a pair of bonded workpieces is determined. FIGS. 4-6 and 18 illustrate some embodiments corresponding to act 2302.

At 2304, a first beam of electromagnetic radiation is generated toward a perimeter of the interface between the pair of bonded workpieces. FIGS. 19 and/or 21 illustrate cross-sectional views 1900 and/or 2100, respectively, of some embodiments corresponding to act 2304.

At 2306, a first radiation intensity of the first beam of electromagnetic radiation that makes it past the perimeter of the interface is measured. FIGS. 20 and/or 22 illustrate some embodiments corresponding to act 2306.

At 2308, a second beam of electromagnetic radiation is generated toward the perimeter of the interface, the second beam having a different beam size than the first beam. FIGS. 19 and/or 21 illustrate cross-sectional views 1900 and/or 2100, respectively, of some embodiments corresponding to act 2308.

At 2310, a second radiation intensity of the second beam of electromagnetic radiation that makes it past the perimeter of the interface is measured. FIGS. 20 and/or 22 illustrate some embodiments corresponding to act 2310.

At 2312, a position of an underfill that exists along the interface is determined based on the first measured radiation intensity and the second measured radiation intensity. FIGS. 20 and/or 22 illustrate some embodiments corresponding to act 2312.

At 2314, a thinning process is performed on the pair of bonded workpieces. In some embodiments, the underfill deposited at the interface may help prevent peeling of dielectric layers on the pair of bonded workpieces during the thinning process.

In some embodiments, the pair of bonded workpieces are continuously rotated clockwise or counterclockwise during one or more acts of the method 2300.

Thus, the present disclosure relates to a method for determining a position of an interface between a pair of bonded workpieces with improved accuracy, and further relates to a process tool for performing said method.

Accordingly, in some embodiments, the present disclosure relates to a method. The method comprises generating electromagnetic radiation that is directed toward a perimeter of a pair of bonded workpieces and toward a radiation sensor that is arranged behind the perimeter of the pair of bonded workpieces. The electromagnetic radiation is scanned along a vertical axis. The vertical axis extends from below the pair of bonded workpieces to above the pair of bonded workpieces. An intensity of the electromagnetic radiation that impinges on the radiation sensor is measured throughout the scanning. Measuring the intensity comprises recording a plurality of intensity values of the electromagnetic radiation at a plurality of different positions along the vertical axis extending past top and bottom surfaces of the pair of bonded workpieces. A position of an interface between the pair of bonded workpieces is determined based on a maximum measured intensity value of the plurality of intensity values.

In other embodiments, the present disclosure relates to a method. The method comprises determining a position of an interface between a pair of bonded workpieces. A first beam of electromagnetic radiation is generated toward a perimeter of the interface between the pair of bonded workpieces and toward a radiation sensor that is arranged behind the perimeter of the interface. The radiation sensor measures a first intensity of the first beam of electromagnetic radiation that impinges on the radiation sensor. An underfill is deposited at the interface between the pair of bonded workpieces. A second beam of electromagnetic radiation is generated toward the perimeter of the interface between the pair of bonded workpieces and toward the radiation sensor that is arranged behind the perimeter of the interface. The radiation sensor measures a second intensity of the second beam of electromagnetic radiation that impinges on the radiation sensor. A volume of the underfill is determined based on a difference between the second intensity and the first intensity.

In yet other embodiments, the present disclosure relates to a process tool comprising a workpiece holder structure configured to hold a workpiece. A radiation source is adjacent to the workpiece holder structure and is arranged along a perimeter of the workpiece holder structure. The radiation source is configured to generate electromagnetic radiation. A radiation sensor is arranged along the perimeter of the workpiece holder structure and is spaced apart from the radiation source. The radiation sensor is configured to measure an intensity of electromagnetic radiation that impinges on the radiation sensor. Sensor control circuitry is coupled to the radiation sensor and is configured to determine a position of an interface between a pair of bonded workpieces that are arranged on the workpiece holder structure. The position of the interface is determined based on the intensity of the electromagnetic radiation measured by the radiation sensor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
generating electromagnetic radiation that is directed toward a perimeter of a pair of bonded workpieces and toward a radiation sensor that is arranged behind the perimeter of the pair of bonded workpieces;
scanning the electromagnetic radiation along a vertical axis that extends from below the pair of bonded workpieces to above the pair of bonded workpieces;
measuring an intensity of the electromagnetic radiation that impinges on the radiation sensor throughout the scanning, wherein measuring the intensity comprises recording a plurality of intensity values of the electromagnetic radiation at a plurality of different positions along the vertical axis extending past top and bottom surfaces of the pair of bonded workpieces; and
determining a position of an interface between the pair of bonded workpieces based on a maximum measured intensity value of the plurality of intensity values.

2. The method of claim 1, wherein the position of the plurality of different positions along the vertical axis that corresponds with the maximum measured intensity value represents the position of the interface.

3. The method of claim 1, further comprising:
forming an underfill at the interface between the pair of bonded workpieces after determining the position of the interface.

4. The method of claim 3, further comprising:
generating a separate beam of electromagnetic radiation that is directed toward the interface and toward the radiation sensor after the underfill is formed at the interface; and
measuring, with the radiation sensor, a separate radiation intensity of the separate beam of electromagnetic radiation that impinges on the radiation sensor.

5. The method of claim 4, further comprising:
determining a volume of the underfill based on a difference between the separate radiation intensity and the maximum measured intensity value.

6. The method of claim 3, further comprising:
determining a position of the underfill based on a measured radiation intensity of a first beam of electromagnetic radiation having a first beam size, and based on a second measured radiation intensity of a second beam of electromagnetic radiation having a second beam size different from the first beam size.

7. The method of claim 1,
wherein a first actuator moves a radiation source along the vertical axis, the radiation source configured to generate the electromagnetic radiation; and
wherein a second actuator moves the radiation sensor along the vertical axis in synchronization with the first actuator.

8. A method, comprising:
determining a position of an interface between a pair of bonded workpieces;
generating a first beam of electromagnetic radiation that is directed toward a perimeter of the interface between the pair of bonded workpieces and toward a radiation sensor that is arranged behind the perimeter of the interface;
measuring, with the radiation sensor, a first intensity of the first beam of electromagnetic radiation that impinges on the radiation sensor;
depositing an underfill at the interface between the pair of bonded workpieces;
generating a second beam of electromagnetic radiation that is directed toward the perimeter of the interface between the pair of bonded workpieces and toward the radiation sensor that is arranged behind the perimeter of the interface;
measuring, with the radiation sensor, a second intensity of the second beam of electromagnetic radiation that impinges on the radiation sensor; and
determining a volume of the underfill based on a difference between the second intensity and the first intensity.

9. The method of claim 8, wherein determining the position of the interface comprises scanning the first beam of electromagnetic radiation along a vertical axis and measuring, with the radiation sensor, the first intensity of the first beam of electromagnetic radiation that impinges on the radiation sensor throughout the scanning, wherein the vertical axis extends from below the pair of bonded workpieces to above the pair of bonded workpieces.

10. The method of claim 9, wherein determining the position of the interface further comprises determining a maximum intensity measured by the radiation sensor and determining the position along the vertical axis that corresponds to the maximum intensity.

11. The method of claim 8, wherein determining the volume of the underfill comprises subtracting a beam-received area of the radiation sensor that sensed electromagnetic radiation during the generation of the second beam of electromagnetic radiation from a beam-received area of the radiation sensor that sensed electromagnetic radiation during the generation of the first beam of electromagnetic radiation.

12. The method of claim 8, wherein determining the volume of the underfill comprises integrating intensity data recorded during the generation of the first beam of electromagnetic radiation and integrating intensity data recorded during the generation of the second beam of electromagnetic radiation.

13. The method of claim 8, further comprising:
depositing an additional underfill at the interface between the pair of bonded workpieces.

14. The method of claim 13, further comprising:
determining a new volume of the underfill and the additional underfill combined.

15. A method comprising:
determining a position of an interface between a pair of bonded workpieces;
depositing an underfill along the interface between the pair of bonded workpieces;
generating, with a radiation source, a first beam of electromagnetic radiation that is directed toward a perimeter of the interface between the pair of bonded workpieces and toward a radiation sensor that is arranged behind the perimeter of the interface, the first beam having a first beam size;
measuring, with the radiation sensor, a first intensity of the first beam of electromagnetic radiation that impinges on the radiation sensor;
generating, with the radiation source, a second beam of electromagnetic radiation that is directed toward the perimeter of the interface between the pair of bonded workpieces and toward the radiation sensor that is arranged behind the perimeter of the interface, the second beam having a second beam size different than the first beam size;
measuring, with the radiation sensor, a second intensity of the second beam of electromagnetic radiation that impinges on the radiation sensor; and
determining, with sensor control circuitry, a position of the underfill relative to the position of the interface between the pair of bonded workpieces based on the first intensity and the second intensity.

16. The method of claim 15, further comprising:
adjusting the first beam to have the first beam size by adjusting a position of an optical assembly attached to the radiation source to a first position; and
adjusting the second beam to have the second beam size by adjusting the position of the optical assembly to a second position different than the first position.

17. The method of claim 15, further compromising:
determining that the underfill is offset from the interface between the pair of bonded workpieces in response to determining that the second intensity is different than the first intensity.

18. The method of claim 15, further compromising:
determining that the underfill is at the interface between the pair of bonded workpieces in response to determining that the second intensity is approximately equal to the first intensity.

19. The method of claim 15, wherein determining the position of the interface comprises scanning a third beam of electromagnetic radiation along a vertical axis, measuring, with the radiation sensor, a third intensity of the third beam of electromagnetic radiation that impinges on the radiation sensor throughout the scanning, and determining a maximum of the third intensity.

20. The method of claim 15, wherein the second beam size is greater than the first beam size.

* * * * *